US012652929B2

(12) United States Patent
Heo et al.

(10) Patent No.: US 12,652,929 B2
(45) Date of Patent: Jun. 9, 2026

(54) DISPLAY DEVICE AND METHOD OF MANUFACTURING THE SAME

(71) Applicant: Samsung Display Co., LTD., Yongin-si (KR)

(72) Inventors: Eui Kang Heo, Yongin-si (KR); Chong Sup Chang, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 429 days.

(21) Appl. No.: 18/322,659

(22) Filed: May 24, 2023

(65) Prior Publication Data

US 2024/0138231 A1 Apr. 25, 2024
US 2024/0237479 A9 Jul. 11, 2024

(30) Foreign Application Priority Data

Oct. 21, 2022 (KR) ........................ 10-2022-0136617

(51) Int. Cl.
*H10K 59/80* (2023.01)
*H10K 59/12* (2023.01)
(Continued)

(52) U.S. Cl.
CPC ... *H10K 59/80522* (2023.02); *H10K 59/1201* (2023.02); *H10K 59/124* (2023.02); *H10K 59/88* (2023.02)

(58) Field of Classification Search
CPC ......... H10K 59/80522; H10K 59/1201; H10K 59/124; H10K 59/88; H10K 50/824;
(Continued)

(56) References Cited

U.S. PATENT DOCUMENTS 6,012,881 A 1/2000 Scheer
2009/0302320 A1* 12/2009 Takahashi .............. H10D 86/60
257/E29.273
(Continued)

FOREIGN PATENT DOCUMENTS

CN 114639710 A 6/2022
KR 10-2018-0046229 5/2018
(Continued)

OTHER PUBLICATIONS

Office Action issued Feb. 2, 2026 in Korean Application No. 10-2022-0136617.

*Primary Examiner* — Chad M Dicke
*Assistant Examiner* — Gary Abel
(74) *Attorney, Agent, or Firm* — Harness, Dickey & Pierce, P.L.C.

(57) ABSTRACT

A display device includes a thin-film transistor, an interlayer insulating layer on the thin-film transistor, a source electrode, a drain electrode, and an auxiliary electrode on the interlayer insulating layer, each of the source electrode, the drain electrode, and the auxiliary electrode including a main conductive layer and a sub conductive layer on the main conductive layer, and a via insulating layer on the source electrode, the drain electrode and the auxiliary electrode, the via insulating layer covering the source electrode and the drain electrode and exposing a portion of an upper surface of the second conductive layer of the auxiliary electrode. The via insulating layer includes a first part spaced apart from the upper surface of the second conductive layer of the auxiliary electrode, and the second part adjacent to side surfaces of the main conductive layer and the sub conductive layer of the auxiliary electrode.

16 Claims, 21 Drawing Sheets

(51) Int. Cl.
*H10K 59/124* (2023.01)
*H10K 59/88* (2023.01)

(58) Field of Classification Search
CPC ............. H10K 59/1315; H10K 59/122; H10K
50/805; H10K 59/805; H10K 50/11;
H10K 50/81; H10K 50/822; H10K
59/1213; H10K 71/00; H10K 59/00;
H10D 86/0221; H10D 86/421; H10D
86/60; H10D 86/441
See application file for complete search history.

(56) References Cited

U.S. PATENT DOCUMENTS

| | | | |
|---|---|---|---|
| 2019/0229152 A1* | 7/2019 | Wang ................... | H10K 59/122 |
| 2022/0165980 A1* | 5/2022 | Shim ...................... | H10K 59/38 |
| 2023/0422542 A1* | 12/2023 | Hu ....................... | H10K 59/131 |
| 2024/0130158 A1* | 4/2024 | Hu ....................... | H10K 59/122 |
| 2025/0185476 A1* | 6/2025 | Zhang ............. | H10K 59/80522 |

FOREIGN PATENT DOCUMENTS

| | | |
|---|---|---|
| KR | 10-2018-0062284 | 6/2018 |
| KR | 10-2021-0145907 A | 12/2021 |
| KR | 10-2022-0065949 A | 5/2022 |

* cited by examiner

ED: PXE, CE, EL
OP2: OP2a, OP2b

DSL: DSLa, DSLb, DSLc, DSLd

TFE: TFEa, TFEb, TFEc
ED: PXE, CE, EL
SUB1_1: SUB1a, SUB1b, BRL

VIA: VIAa, VIAb
OP2: OP2a, OP2b

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0136617 under 35 U.S.C. § 119, filed on Oct. 21, 2022, in the Korean Intellectual Property Office, the entire contents of which are incorporated herein by reference.

BACKGROUND

1. Technical Field

Embodiments relate to a display device and a method of manufacturing the display device.

2. Description of the Related Art

Display devices have been more important with developments in multimedia technology. Various display devices such as an organic light-emitting diode (OLED) display device, a liquid crystal display (LCD) device, and the like have been used.

Generally, a display device includes a display panel such as an organic light-emitting display panel or an LCD panel. A light-emitting display panel may include light-emitting elements such as light-emitting diodes (LEDs). Examples of the LEDs include organic LEDs (OLEDs) formed of an organic material as a fluorescent material and inorganic LEDs formed of an inorganic material as a fluorescent material.

A display device includes pixel electrodes and a common electrode. The pixel electrodes may be driven individually on a pixel-by-pixel basis by thin-film transistors (TFTs). The same voltage is applied to the common electrode regardless of pixels. As the size of a display screen increases, the size of the common electrode increases. For example, a voltage drop occurs due to the resistance of the common electrode, and the display quality of the display device may deteriorate.

SUMMARY

Embodiments provide a display device capable of reducing a voltage drop in a common electrode.

Embodiments also provide a method of manufacturing a display device capable of reducing a voltage drop in a common electrode.

However, embodiments are not limited to those set forth herein. The above and other embodiments will become more apparent to one of ordinary skill in the art to which the disclosure pertains by referencing the detailed description of the disclosure given below.

According to an aspect of the disclosure, a display device may include a thin-film transistor disposed on a substrate, an interlayer insulating layer disposed on the thin-film transistor, a source electrode, a drain electrode and an auxiliary electrode disposed on the interlayer insulating layer and spaced apart from each other, each of the source electrode, the drain electrode and the auxiliary electrode including a main conductive layer and a sub conductive layer disposed on an upper surface of the main conductive layer, and a via insulating layer disposed on the source electrode, the drain electrode and the auxiliary electrode, the via insulating layer covering the source electrode and the drain electrode and exposing a portion of an upper surface of the sub conductive layer of the auxiliary electrode, wherein the via insulating layer may include a first part spaced apart from the upper surface of the sub conductive layer of the auxiliary electrode in a thickness direction, and a second part disposed on the first part and adjacent to side surfaces of the main conductive layer of the auxiliary electrode and side surfaces of the sub conductive layer of the auxiliary electrode, and side surfaces of the first part may be inwardly protruded from side surfaces of the second part to form an undercut shape of the via insulating layer.

In an embodiment, each of the source electrode and the drain electrode may further include an upper conductive layer. The upper conductive layer may be disposed on an upper surface of the sub conductive layer of each of the source electrode and the drain electrode, and the upper conductive layer of each of the source electrode and the drain electrode may be in contact with the via insulating layer.

In an embodiment, a distance between a lower surface of the first part of the via insulating layer and the upper surface of the sub conductive layer of the auxiliary electrode may be substantially same as a thickness of the upper conductive layer of each of the source electrode and the drain electrode.

In an embodiment, the main conductive layer of each of the source electrode, the drain electrode and the auxiliary electrode may include at least one of copper (Cu) and aluminum (Al), the sub conductive layer of each of the source electrode, the drain electrode and the auxiliary electrode may include at least one of titanium (Ti), molybdenum (Mo), and a conductive oxide, and the upper conductive layer of each of the source electrode and the drain electrode may include at least one of Cu and Al.

In an embodiment, the display device may further include a pixel electrode disposed on the via insulating layer and connected to the drain electrode through a contact hole penetrating the via insulating layer, wherein the pixel electrode may not overlap the auxiliary electrode.

In an embodiment, the display device may further include a pixel-defining film disposed on the pixel electrode and the via insulating layer to expose a portion of an upper surface of the pixel electrode and a portion of the upper surface of the sub conductive layer of the auxiliary electrode, and a light-emitting layer disposed on the pixel-defining film, wherein the light-emitting layer is in contact with the portion of the upper surface of the pixel electrode exposed by the pixel-defining film and is disconnected in the portion of the auxiliary electrode exposed by the pixel-defining film.

In an embodiment, the display device may further include a common electrode disposed on the light-emitting layer, wherein the common electrode surrounds the first part of the via insulating layer and is in contact with a portion of the upper surface of the sub conductive layer of the auxiliary electrode.

In an embodiment, the display device may further include a light-emitting dummy layer disposed on the upper surface of the sub conductive layer of the auxiliary electrode, the light-emitting dummy layer and the light-emitting layer formed of a same layer, wherein the light-emitting dummy layer may be disconnected from the light-emitting layer.

In an embodiment, the display device may further include a dummy common electrode disposed on the upper surface of the sub conductive layer of the auxiliary electrode and covering the light-emitting dummy layer, the dummy common electrode and the common electrode formed of a same layer, wherein the dummy common electrode may be spaced apart from the common electrode, and may be disposed on the upper surface of the sub conductive layer of the auxiliary electrode.

In an embodiment, the common electrode covers the light-emitting dummy layer and a portion of the upper surface of the sub conductive layer of the auxiliary electrode that is exposed by the light-emitting dummy layer.

According to an aspect of the disclosure, a display device may include a thin-film transistor disposed on a substrate, an interlayer insulating layer disposed on the thin-film transistor, a source electrode, a drain electrode and an auxiliary electrode disposed on the interlayer insulating layer and spaced apart from each other, each of the source electrode, the drain electrode and the auxiliary electrode including a main conductive layer, and a sub conductive layer disposed on an upper surface of the main conductive layer, and a via insulating layer disposed on the source electrode, the drain electrode and the auxiliary electrode, the via insulating layer covering the source electrode and the drain electrode and including a first opening exposing an upper surface of the sub conductive layer of the auxiliary electrode, wherein the first opening includes a first opening part exposing a first portion of the upper surface of the sub conductive layer of the auxiliary electrode, and a second opening part disposed on the first part, having a width greater than a width of the first part, and exposing a second portion of the upper surface of the sub conductive layer of the auxiliary electrode greater than the first portion of the upper surface of the sub conductive layer of the auxiliary electrode.

In an embodiment, each of the source electrode and the drain electrode further includes an upper conductive layer. The upper conductive layer may be disposed on an upper surface of the sub conductive layer of each of the source electrode and the drain electrode, and the upper conductive layer of each of the source electrode and the drain electrode may be in contact with the via insulating layer.

In an embodiment, the second opening part of the via opening may be spaced apart from the upper surface of the sub conductive layer of the auxiliary electrode in a thickness direction, and a distance between a lower portion of the first opening part of the opening of the via insulating layer and the upper surface of the sub conductive layer of the auxiliary electrode may be substantially same as a thickness of the upper conductive layer of each of the source electrode and the drain electrode.

In an embodiment, the main conductive layer of each of the source electrode, the drain electrode and the auxiliary electrode may include at least one of copper (Cu) and aluminum (Al), the sub conductive layer of each of the source electrode, the drain electrode and the auxiliary electrode may include at least one of titanium (Ti), molybdenum (Mo), and a conductive oxide, and the upper conductive layer of each of the source electrode and the drain electrode includes at least one of Cu and Al.

In an embodiment, the display device may further include a pixel electrode disposed on the via insulating layer and in contact with the source electrode and the drain electrode through a contact hole, which penetrates the via insulating layer, wherein the pixel electrode does not overlap the auxiliary electrode.

In an embodiment, the display device may further include a pixel-defining film including a first opening exposing a portion of an upper surface of the pixel electrode, and a second opening exposing a portion of the upper surface of the sub conductive layer of the auxiliary electrode, and a light-emitting layer disposed on the pixel-defining film, wherein the light-emitting layer is in contact with the upper surface of the pixel electrode in the first opening of the pixel-defining film, and is disconnected in the second opening of the pixel-defining film.

In an embodiment, the display device may further include a common electrode disposed on the light-emitting layer, wherein the common electrode may extend to the opening of the via insulating layer beyond the second opening of the pixel-defining film and may be in contact with a portion of the upper surface of the sub conductive layer of the auxiliary electrode.

In an embodiment, the display device may further include a light-emitting dummy layer disposed on the upper surface of the sub conductive layer of the auxiliary electrode, the light-emitting dummy layer and the light-emitting layer formed of a same layer, wherein the light-emitting dummy layer may be disconnected from the light-emitting layer.

According to an aspect of the disclosure, a method of manufacturing a display device may include forming a thin-film transistor on a substrate, forming an interlayer insulating layer on the thin-film transistor, forming a source electrode, a drain electrode and an auxiliary electrode as a same layer on the interlayer insulating layer, each of the source electrode, the drain electrode and the auxiliary electrode including a main conductive layer, a sub conductive layer disposed on an upper surface of the main conductive layer, and an upper conductive layer disposed on an upper surface of the sub conductive layer, forming a via insulating layer on the source electrode, the drain electrode and the auxiliary electrode, the via insulating layer covering the source electrode, the drain electrode and exposing the upper surface of the sub conductive layer of the auxiliary electrode, forming a pixel electrode layer on the via insulating layer, forming a photoresist pattern on a portion of the pixel electrode layer overlapping the source electrode and the drain electrode, and forming an undercut in the via insulating layer by etching the upper conductive layer of the auxiliary electrode and a portion of the pixel electrode layer where the photoresist pattern is not formed.

In an embodiment, the main conductive layer and the upper conductive layer of each of the source electrode, the drain electrode and the auxiliary electrode may include at least one of copper (Cu) and aluminum (Al), and the sub conductive layer of each of the source electrode, the drain electrode and the auxiliary electrode may include at least one of titanium (Ti), molybdenum (Mo), and a conductive oxide.

According to the aforementioned and other embodiments of the disclosure, a voltage drop in a common electrode may be reduced. Also, a display device capable of reducing a voltage drop in a common electrode may be provided.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

5

6

Figure 1:
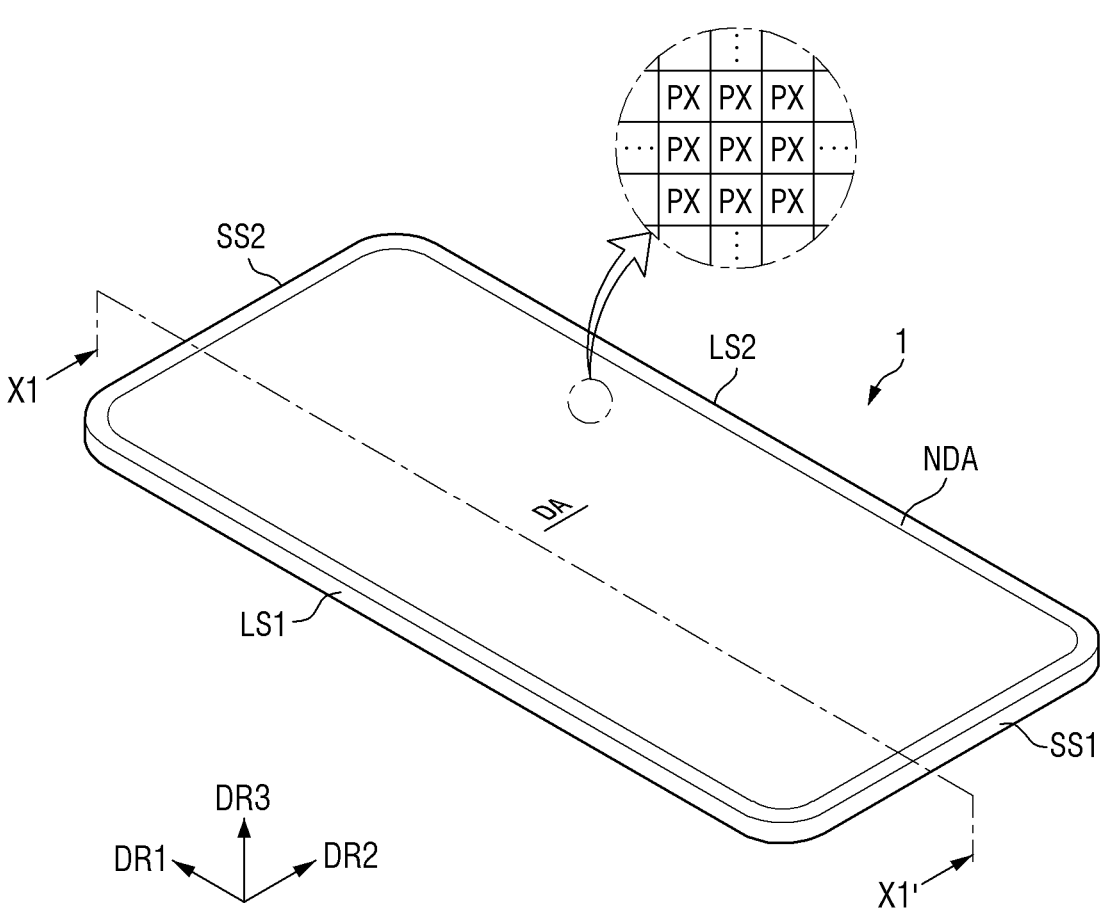
FIG. 1 is a schematic perspective view of a display device according to an embodiment.
Figure 4:
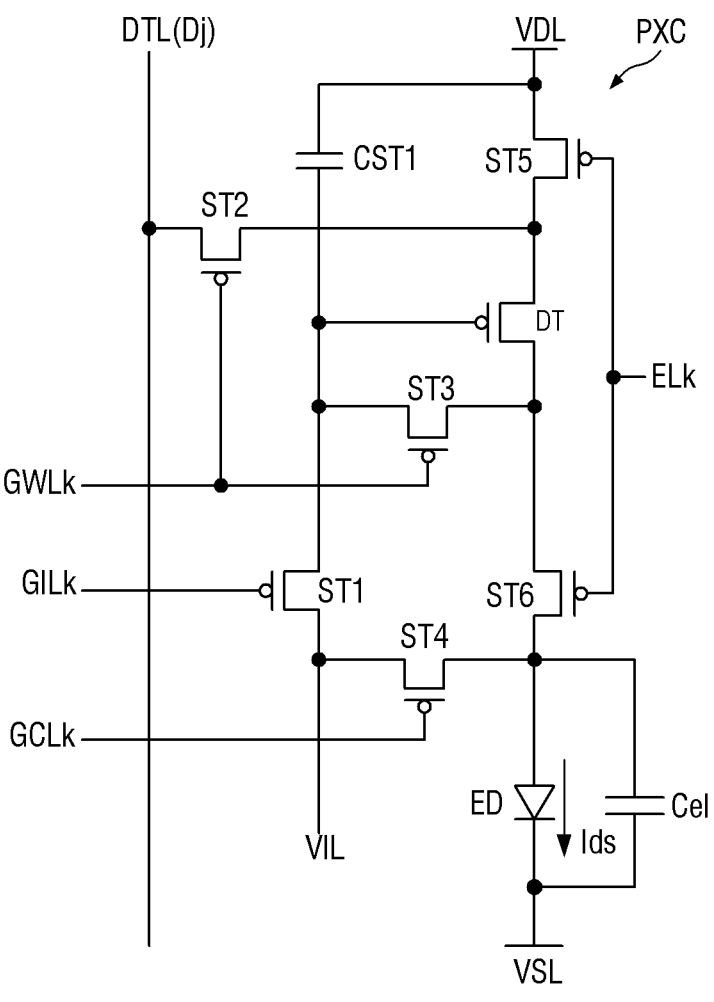
Figure 5:
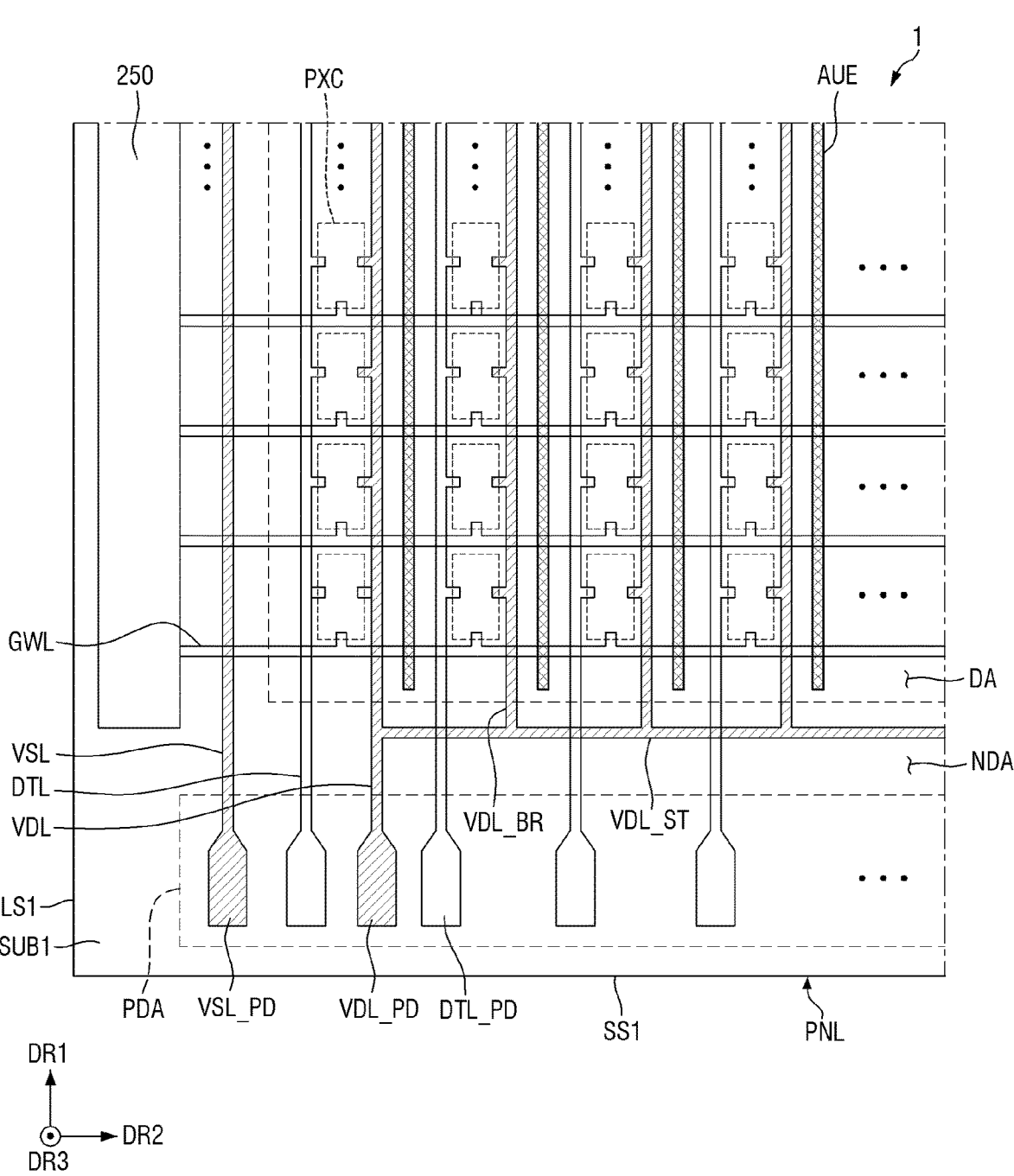
Figure 6:
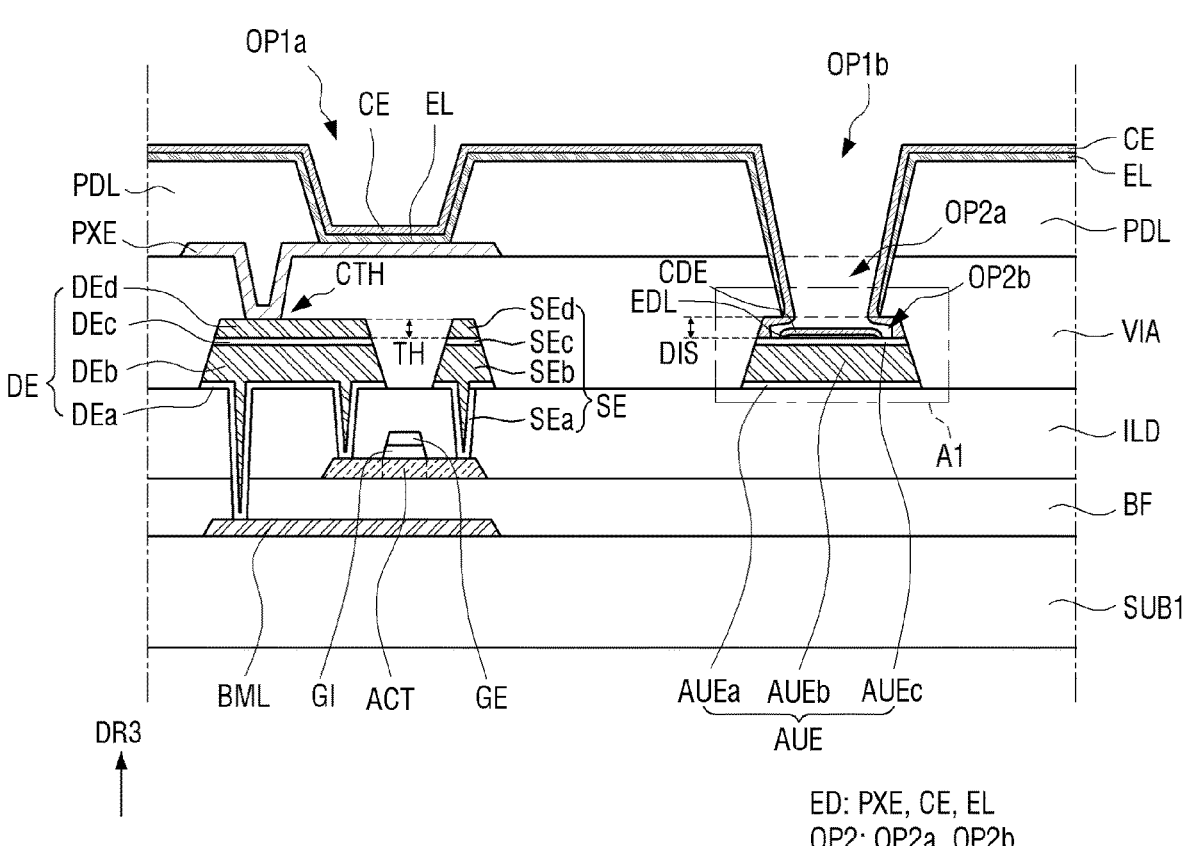
Figure 7:
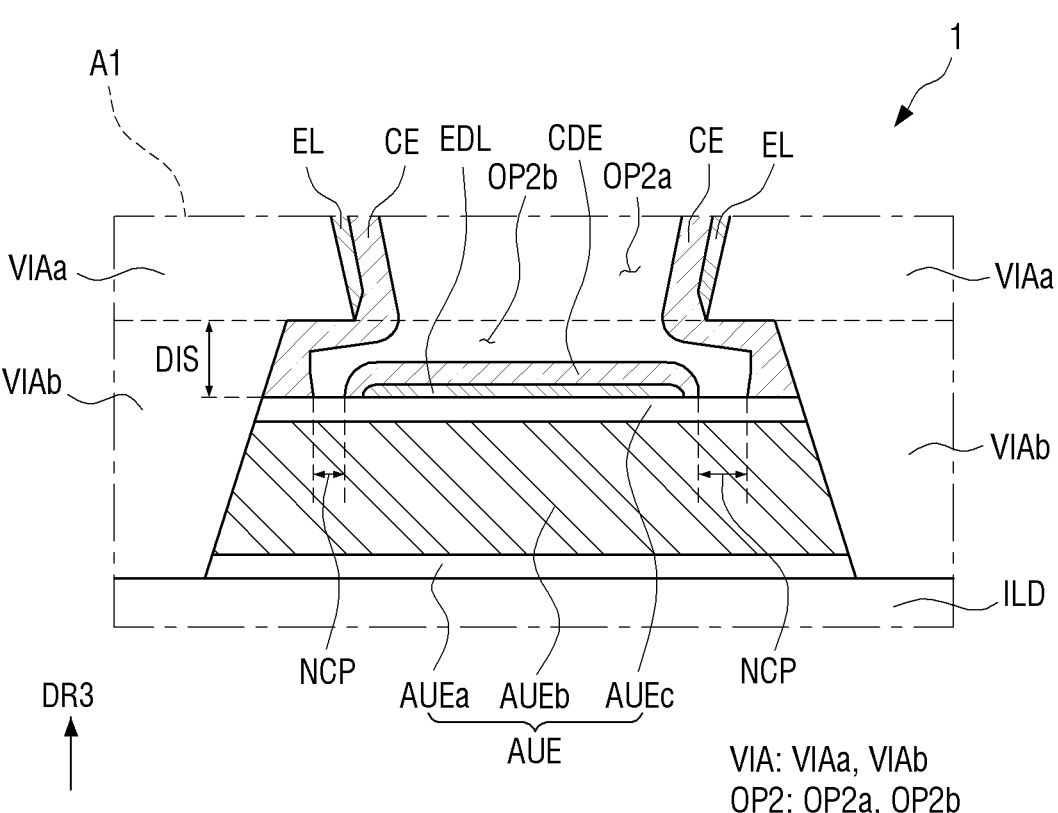
Figure 8:
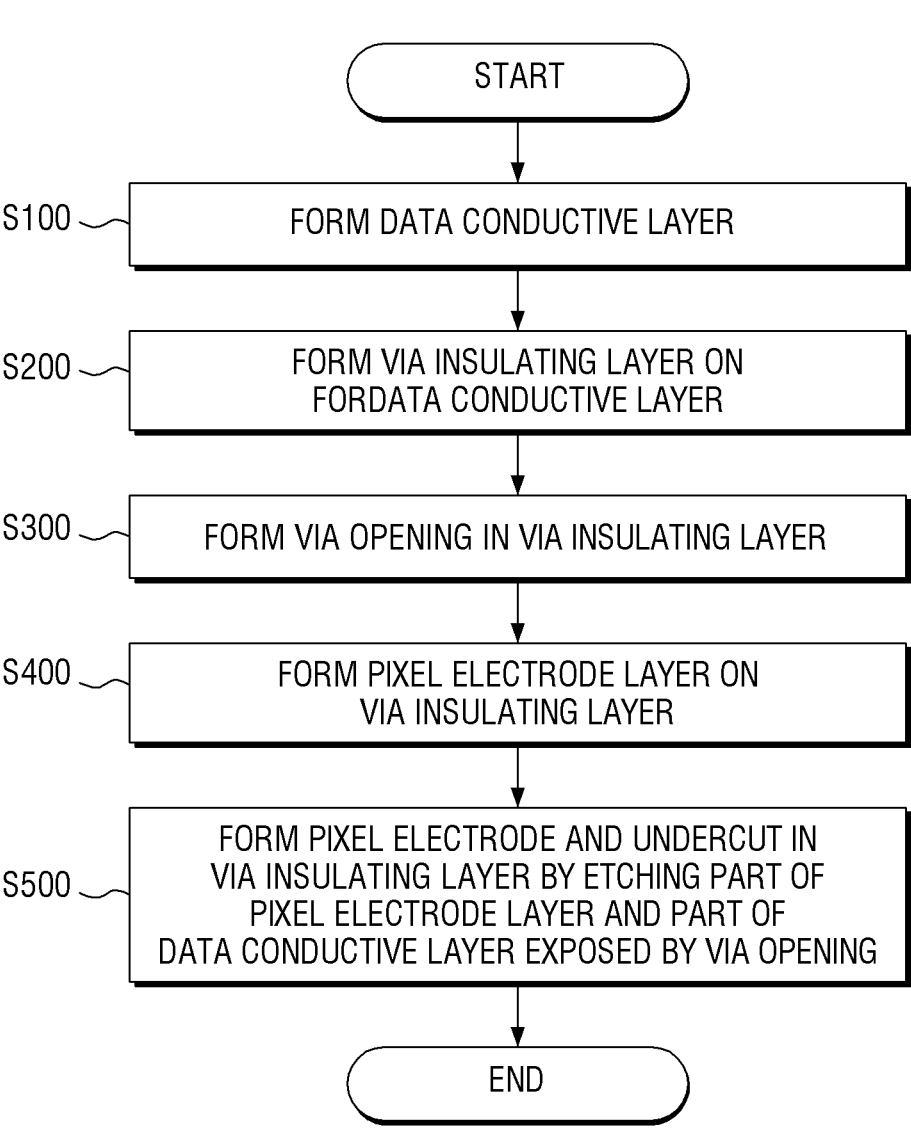
Figure 19:
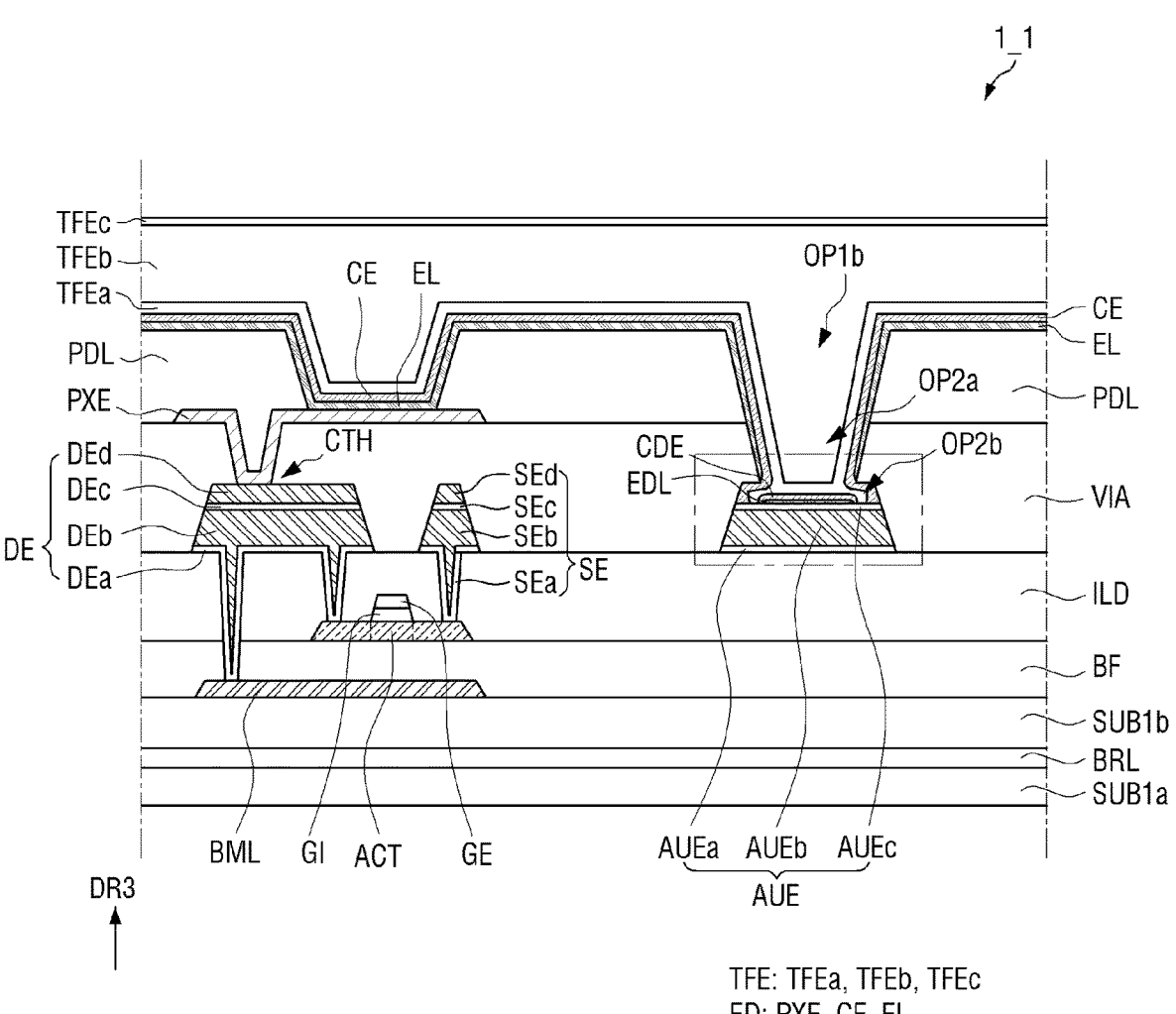
Figure 20:
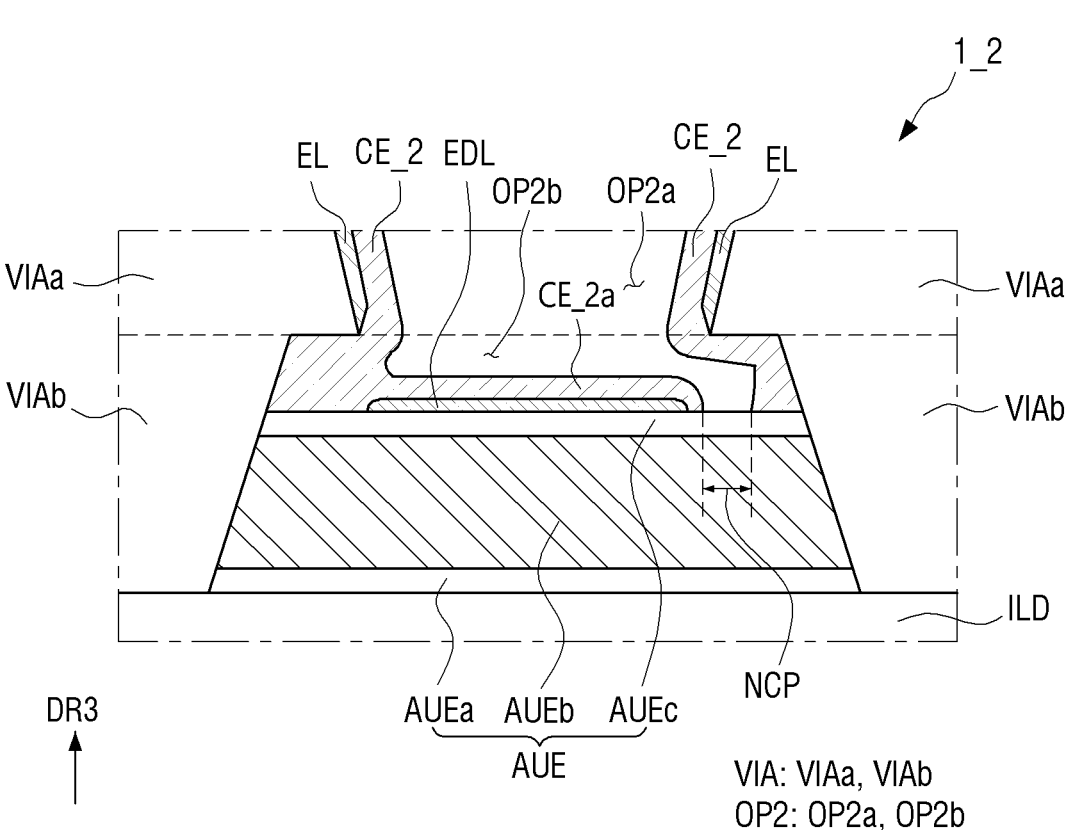
Figure 21:
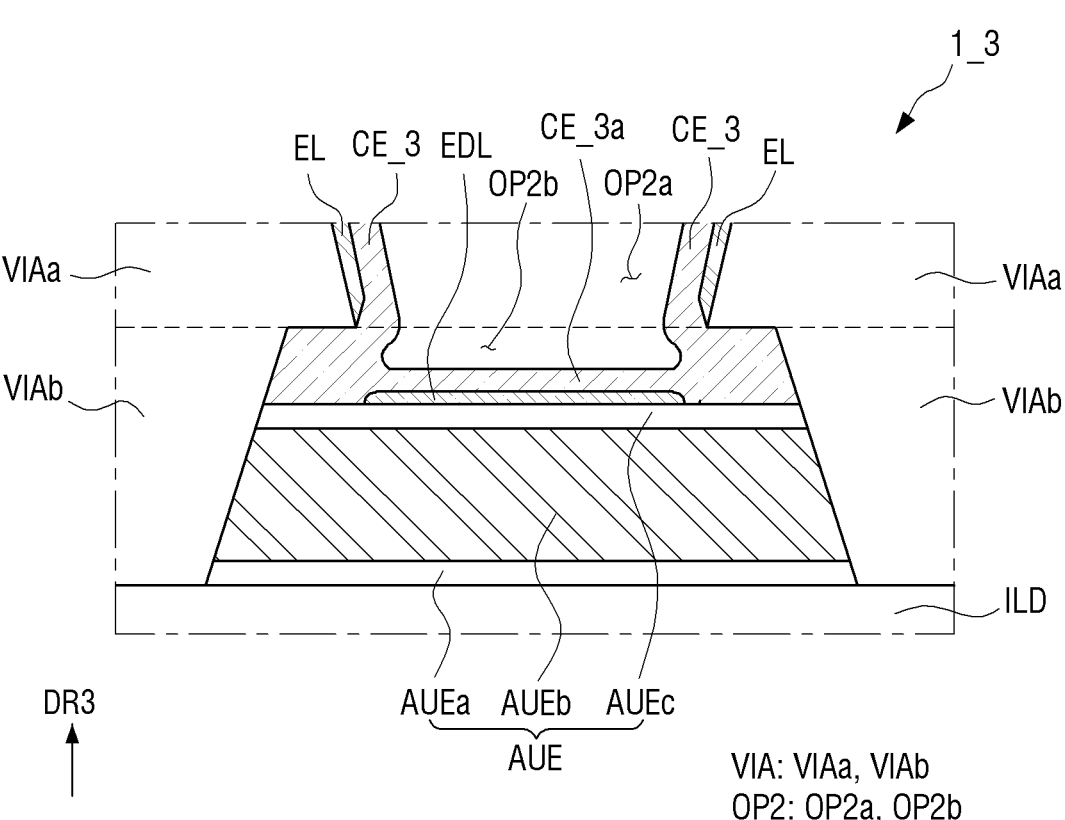

FIG. 4 is a schematic diagram of an equivalent circuit of a pixel according to an embodiment;

FIG. 5 is a schematic layout view of a display panel of the display device of FIG. 1;

FIG. 6 is a schematic cross-sectional view of a pixel of the display device of FIG. 1;

FIG. 7 is an enlarged cross-sectional view of an area A1 of FIG. 6;

FIGS. 8 through 18 illustrate a method of manufacturing a display device according to an embodiment;

FIG. 19 is a schematic cross-sectional view of a pixel of a display device according to another embodiment;

FIG. 20 is a schematic cross-sectional view of an auxiliary electrode of a display device according to another embodiment; and FIG. 21 is a schematic cross-sectional view of an auxiliary electrode of a display device according to another embodiment.

DETAILED DESCRIPTION OF THE EMBODIMENTS

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures.

As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Embodiments will hereinafter be described with reference to the attached drawings.

FIG. 1 is a schematic perspective view of a display device according to an embodiment.

Referring to FIG. 1, first, second, and third directions DR1, DR2, and DR3 are defined as illustrated in FIG. 1. Referring to FIG. 1, the first and second directions DR1 and DR2 may be orthogonal to each other, the first and third directions DR1 and DR3 may be orthogonal to each other, and the second and third directions DR2 and DR3 may be orthogonal to each other. The first direction DR1 may be a vertical direction, the second direction DR2 may be a horizontal direction, and the third direction DR3 may be a top-to-bottom direction, i.e., a thickness direction. The term "direction," as used herein, may refer to both sides in each certain direction. For example, a side in a certain direction may be referred to as a first side in the certain direction, and another side in the certain direction may be referred to as a second side in the certain direction. Referring to FIG. 1, a side in each direction, pointed to by each arrow may be referred to as, but is not limited to, a first side, and the opposite side may be referred to as a second side, but embodiments are not limited thereto.

For example, a surface of the display device 1 (or each element of the display device 1) that faces a direction in which an image is displayed, i.e., the third direction DR3, may be referred to as a top surface (or upper surface), and the opposite surface of the display device 1 may be referred to as a bottom surface (or lower surface). However, embodiments are not limited thereto. In another example, the surfaces of the display device 1 may be referred to as a front side and a rear side or as a first surface and a second surface. When describing the relative position of each element of the display device 1, an element on a first side, in the third direction DR3, of another element may be referred to as being above the other element, and an element on a second side, in the third direction DR3, of another element may be referred to as being below the other element.

The display device 1 may refer to various types of electronic devices that provide a display screen. Examples of the display device 1 may include a mobile phone, a smartphone, a tablet personal computer (PC), an electronic watch, a smartwatch, a watchphone, a mobile communication terminal, an electronic notepad, an electronic book (e-book) reader, a portable multimedia player (PMP), a navigation device, a gaming console, a digital camera, a television (TV), a notebook computer, a netbook computer, a monitor, an electronic billboard, an Internet-of-Things (IoT) device, and the like. The display device 1 will hereinafter be described as being applied to, for example, a mid-size portable device such as a tablet PC.

The planar shape of the display device 1 is not limited. For example, the display device 1 may have various shapes, such as a rectangular shape, a square shape, a rhombus shape, another polygonal shape, a circular shape, or an elliptical shape, according to the field of application thereof. The display device 1 is illustrated as having a rectangular shape with rounded corners and having two long sides aligned in parallel to a first direction DR1. For example, one of the two long sides, e.g., the left long side of the display device 1, will hereinafter be referred to as a first long side LS1, and the other long side, e.g., the right long side of the display device 1 will hereinafter be referred to as a second long side LS2. For example, one of two opposite short sides of the display device 1, e.g., the lower short side of the display device 1, will hereinafter be referred to as a first short side SS1, and the other short side, e.g., the upper short side of the display device 1, will hereinafter be referred to as a second short side SS2. The terms "first long side", "second long side", "first short side", and "second short side" may refer to the sides of each element included in the display device 1, having a similar shape and a similar position with the display device 1.

The display device 1 may include a display area DA and a non-display area NDA. The display area DA may be an area in which an image is displayed, and the non-display area NDA may be an area in which an image is not displayed. The non-display area NDA may be disposed around the display area DA. In a case where the display area DA has a rectangular shape, the non-display area NDA may surround the four sides of the display area DA, but embodiments are not limited thereto. In another example, the non-display area NDA may be disposed along only some of the sides of the display area DA. In another example, the non-display area NDA may be disposed inside the display area DA and may be surrounded by the display area DA.

Figure 2:
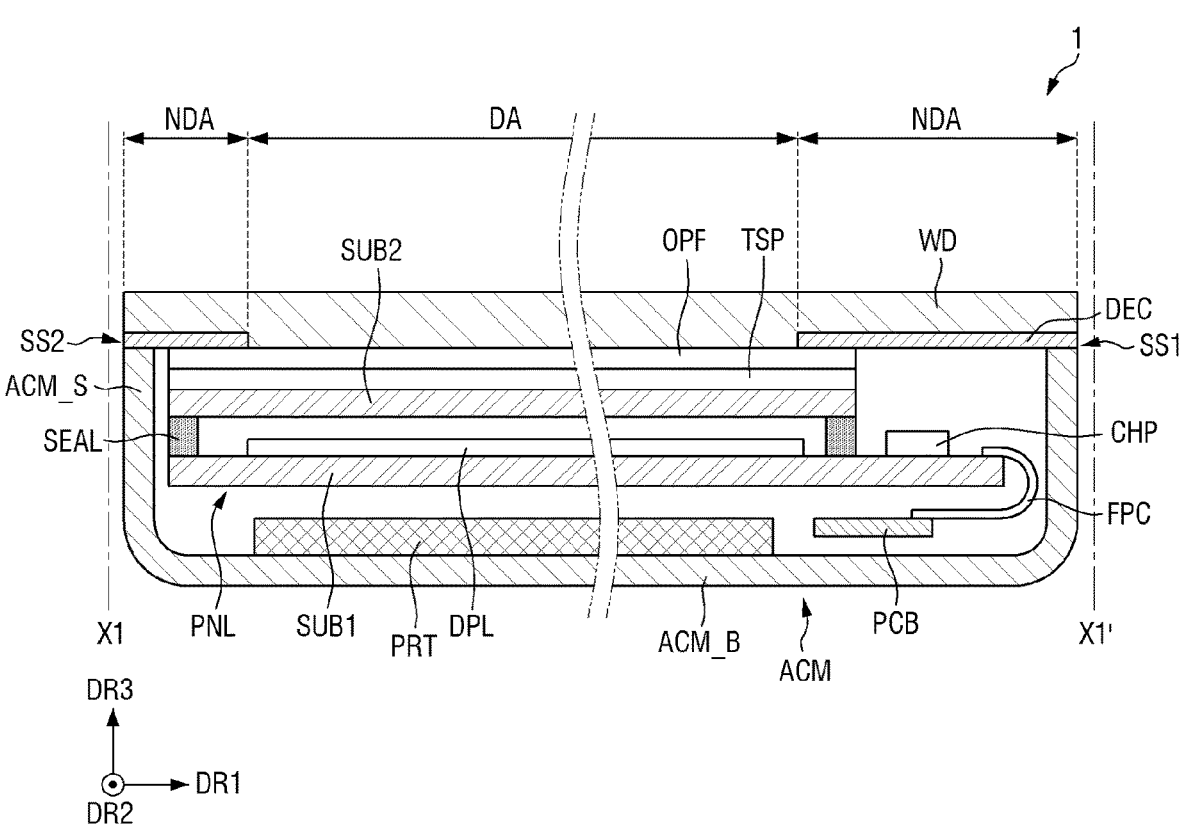
FIG. 2 is a schematic cross-sectional view taken along line X1-X1' of FIG. 1.

FIG. 2 is a schematic cross-sectional view taken along line X1-X1' of FIG. 1.

Referring to FIGS. 1 and 2, the display device 1 may include a display panel PNL. The display device 1 may further include a driving unit, which is connected to the display panel PNL, a container ACM, which accommodates the display panel PNL and the driving unit therein, and an optical member OPF, which is disposed on the display panel PNL.

The term "connect" or "connection", as used herein, not only means that an element is coupled to another element through physical contact, but also means that an element is coupled to another element via yet another element. An integral member may be understood as having parts connected to one another. For example, the connection between two elements may encompass not only a direct connection between the two elements, but also an electrical connection between the two elements.

The display panel PNL may include a display screen. The display panel PNL may include a display screen displaying an image in the third direction DR3. The display panel PNL may have a similar shape to the display device 1.

Examples of the display panel PNL may include an organic light-emitting display panel, a micro-light-emitting diode (microLED) display panel, a nano-light-emitting diode (nanoLED) display panel, a quantum-dot light-emitting display panel, a liquid crystal display (LCD) panel, a plasma display panel (PDP), a field emission display (FED) panel, an electrophoretic display (EPD) panel, and an electrowetting display (EWD) panel. The display panel PNL will hereinafter be described as being, for example, an organic light-emitting display panel, but embodiments are not limited thereto. Various other display panels may be applicable to the display panel PNL.

The display panel PNL may include a first substrate SUB1 and a display layer DPL, which is disposed on the first substrate SUB1. The display panel PNL may further include a second substrate SUB2, which faces the first substrate SUB1, and a sealing member SEAL, which couples the first and second substrates SUB1 and SUB2 along the edge portions of the display panel PNL. The second substrate SUB2 may be spaced apart from the top surface (or upper surface) of the display layer DPL. For example, the gap between the second substrate SUB2 and the display layer DPL may be empty or may be filled with a gas such as the air or a solid filler. In another example, the second substrate SUB2 and the top surface of the display layer DPL may be in contact with each other.

The first substrate SUB1 may provide space in which the display layer DPL is disposed. The first substrate SUB1 may be an insulating substrate or a semiconductor substrate. The first substrate SUB1 may be a rigid substrate. For example, the first substrate SUB1 may include glass.

The second substrate SUB2 may protect the display layer DPL, from above the display layer DPL. The second substrate SUB2 may be an encapsulation layer for preventing the penetration of moisture or a gas. As the second substrate SUB2 is placed in the display direction of the display layer DPL, a transparent insulating substrate may be used as the second substrate SUB2. For example, the second substrate SUB2 may include glass.

The sealing member SEAL may be disposed along the edge portions of each of the first and second substrates SUB1 and SUB2 to couple the first and second substrates SUB1 and SUB2. The sealing member SEAL may have an encapsulation function for preventing the penetration of moisture or a gas from the sides of the display panel PNL. The sealing member SEAL may include, for example, frit, a photocurable resin, or a thermosetting resin.

The inner space defined by the first substrate SUB1, the second substrate SUB2, and the sealing member SEAL may be sealed. The display layer DPL may be disposed in the sealed inner space.

The display layer DPL may be divided into a plurality of pixels PX in a plan view. The pixels PX may include a plurality of color pixels. For example, the pixels PX may include red pixels, green pixels, and blue pixels, which are alternately arranged.

The driving unit may drive the display panel PNL. At least some of the elements of the driving unit may drive the pixels PX of the display layer DPL.

The driving unit may be provided as a chip, a film, and/or a circuit substrate. For example, the driving unit may include a driver chip CHP, a flexible printed circuit board FPC, and a printed circuit board PCB. The flexible printed circuit board FPC may be flexible, and the printed circuit board PCB may be rigid. However, embodiments are not limited thereto.

The driver chip CHP and/or the flexible printed circuit board FPC may be mounted on the first substrate SUB1. For example, the driver chip CHP and the flexible printed circuit board FPC may be electrically connected and attached to pad electrodes provided in the display layer DPL on the first substrate SUB1, through anisotropic conductive films or ultrasonic bonding. The printed circuit board PCB may be attached to an end portion of the flexible printed circuit board FPC. The flexible printed circuit board FPC may be bent in a downward direction from the first substrate SUB1, and the printed circuit board PCB may be disposed below the first substrate SUB1.

FIG. 2 illustrates that the driver chip CHP is mounted on the first substrate SUB1, but the driver chip CHP may be mounted on the flexible printed circuit board FPC.

The driver chip CHP and the flexible printed circuit board FPC may be mounted on an end portion of the first substrate SUB1. An area (hereinafter, the mounting area) of the first substrate SUB1 where the driver chip CHP is mounted may be disposed adjacent to the first short side SS1, which is on a first side, in the first direction DR1, of the display device 1, but embodiments are not limited thereto. In another example, the mounting area may be disposed adjacent to one of the first and second long sides LS1 and LS2.

The mounting area of the first substrate SUB1 may be disposed on the outside of the sealing member SEAL. As the mounting area of the first substrate SUB1 is disposed in the non-display area NDA, the non-display area NDA may have a larger width along the first short side SS1 where the mounting area of the first substrate SUB1 is positioned than along the first long side LS1, the second long side LS2, and the second short side SS2.

The mounting area of the first substrate SUB1 may not overlap the second substrate SUB2. For example, the first short side SS1 of the first substrate SUB1 where the mounting area of the first substrate SUB1 is disposed may protrude outwardly beyond the first short side SS1 of the second substrate SUB2. The other sides of the first substrate SUB1, i.e., the first long side LS1, the second long side LS2, and the second short side SS2 of the first substrate SUB1, may be aligned with the other sides of the second substrate SUB2, i.e., the first long side LS1, the second long side LS2, and the second short side SS2 of the second substrate SUB2, and with the sealing member SEAL.

The display device 1 may further include a touch member TSP. The touch member TSP may be implemented as a film or a panel and may then be attached on one surface of the second substrate SUB2 of the display panel PNL. In another example, the touch member TSP may be formed on (e.g., directly on) a surface of the second substrate SUB2 of the display panel PNL as a layer.

The optical member OPF may be disposed above the display panel PNL. For example, the optical member OPF may be a polarizer. The polarizer may reduce the reflection of external light. The polarizer may be formed as a film and may be attached on the display panel PNL. In another example, the optical member OPF may be a viewing angle control film or a lenticular film for realizing a three-dimensional (3D) image. The optical member OPF may include two or more members having an optical function.

The display device 1 may further include a window member WD. The window member WD may be disposed above the display panel PNL to protect the display panel PNL from external shock. The window member WD may form the upper exterior of the display device 1. In a case where the display device 1 includes the optical member OPF, the window member WD may be disposed on the optical member OPF. For example, an optical film such as an anti-fingerprint film may be further disposed on the window member WD.

The window member WD may cover the display panel PNL in a plan view. The window member WD may cover the second substrate SUB2 and the first short side SS1 of the first substrate SUB1, which protrudes beyond the first short side SS1 of the second substrate SUB2. The window member WD may further include a printed layer DEC, which is disposed along the edge portions of the window member WD. The printed layer DEC may be disposed in the non-display area NDA to form the bezel of the display device 1. The printed layer DEC may function as a decorative layer to decorate the exterior of the display device 1, may cover a lower structure of the display device 1, and may prevent leakage of light.

The container ACM may accommodate the display panel PNL, the flexible printed circuit board FPC, and the printed circuit board PCB, from below the display panel PNL. The container ACM may include a bottom portion (or lower portion) ACM_B and sidewalls ACM_S, which extend from the edge portions of the bottom portion (or lower portion) ACM_B in the third direction DR3. The top surface (or upper surfaces) of the sidewalls ACM_S may be coupled to the bottom surface (or lower surface) of the window member WD via a coupling member such as an adhesive layer. The sidewalls ACM_S may be covered and hidden (e.g., completely covered and hidden) by the window member WD in a plan view. In another example, the sidewalls ACM_S may be coupled to the side surfaces of the window member WD.

An empty space may be provided between the bottom portion ACM_B of the container ACM and the display panel PNL, and parts PRT such as a battery may be received in the empty space.

Figure 3:
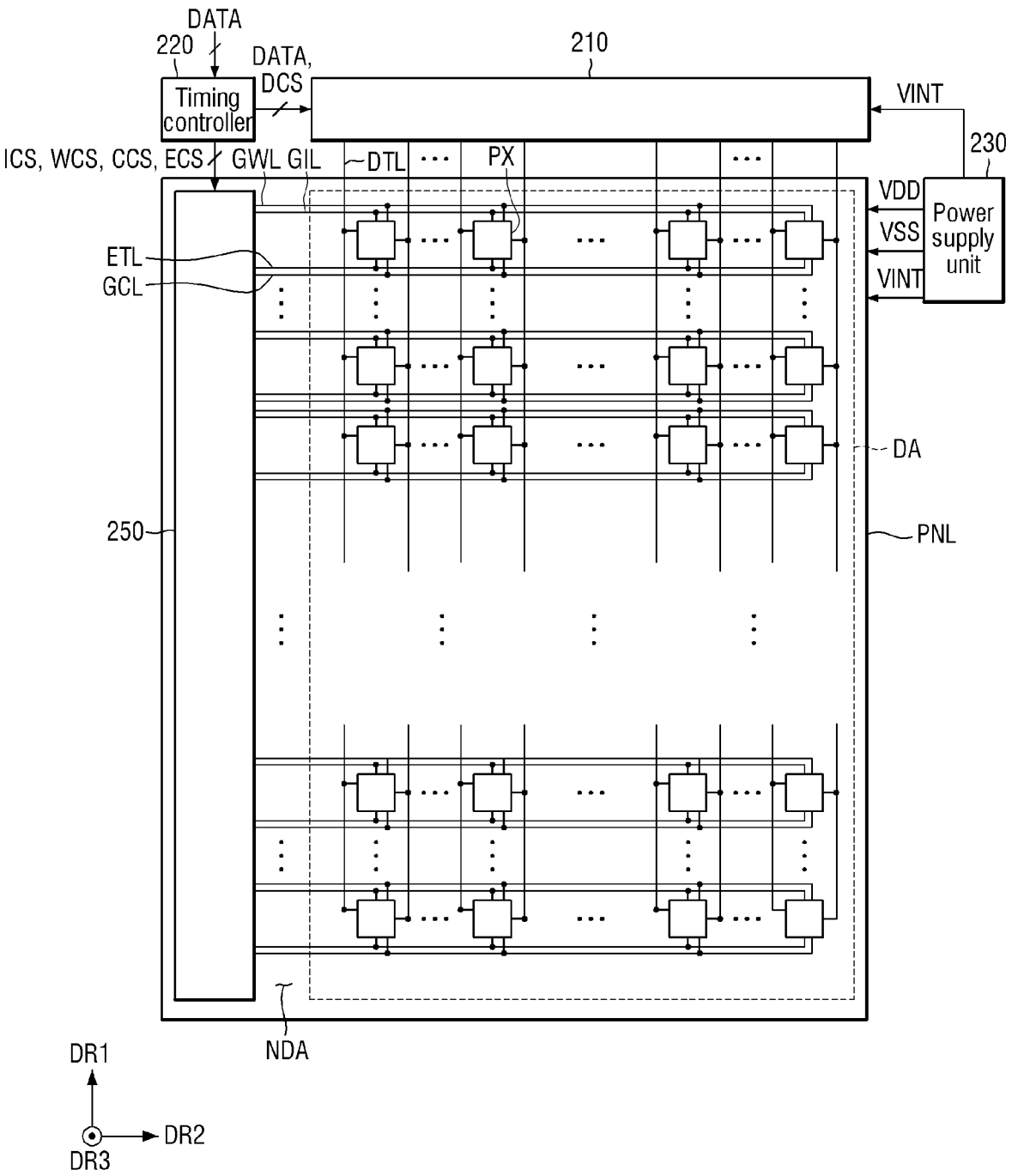
FIG. 3 is a schematic block diagram of the display device of FIG. 1.

FIG. 3 is a block diagram of the display device of FIG. 1.

Referring to FIG. 3, the display area DA of the display device 1 may include the pixels PX, which are arranged in a matrix. The driving unit may include a display scan driver 250, a data driver 210, a timing controller 220, and a power supply unit 230. The driving unit may be positioned in the non-display area NDA, and a portion of the driving unit may be disposed in the display area DA.

Not only the pixels PX, but also a plurality of lines connected to the driving unit may be disposed in the display area DA. The plurality of lines may include a plurality of display write lines GWL, a plurality of display initialization lines GIL, a plurality of display control lines GCL, a plurality of emission lines ETL, and a plurality of data lines DTL.

The data lines DTL may extend in the first direction DR1. The display write lines GWL, the display initialization lines GIL, the display control lines GCL, and the emission lines ETL may extend in the second direction DR2.

Each of the pixels PX may be connected to one of the display write lines GWL, one of the display initialization lines GIL, one of the display control lines GCL, and one of the emission lines ETL. Each of the pixels PX may receive a data voltage from one of the data lines DTL in accordance with a display write signal from one of the display write lines GWL, a display initialization signal from one of the display initialization lines GIL, a display control signal from one of the display control lines GCL, and an emission signal from one of the emission lines ETL and may emit light by applying a driving current to a light-emitting element in accordance with the data voltage.

The display scan driver 250 may be connected to the display write lines GWL, the display initialization lines GIL, the display control lines GCL, and the emission lines ETL. The display scan driver 250 may include a display signal output portion, which outputs display write signals to be applied to the display write lines GWL, display initialization signals to be applied to the display initialization lines GIL, and display control signals to be applied to the display control lines GCL, and an emission signal output portion, which outputs emission signals to be applied to the emission lines ETL.

The display scan driver 250 may receive a write control signal WCS, an initialization control signal ICS, a scan control signal CCS, and an emission control signal ECS from the timing controller 220. The display signal output portion of the display scan driver 250 may generate display write signals and may output the generated display write signals to the display write lines GWL in accordance with the write control signal WCS. For example, the display signal output portion of the display scan driver 250 may generate display initialization signals and output the generated display initialization signals to the display initialization lines GIL in accordance with the initialization control signal ICS. For example, the display signal output portion of the display scan driver 250 may generate display control signals and may output the generated display control signals to the display control lines GCL in accordance with the scan control signal CCS. The emission signal output portion of the display scan driver 250 may generate display emission signals and may output the generated display emission signals to the emission lines ETL in accordance with the emission control signal ECS.

The data driver 210 may convert digital video data DATA into data voltages and may output the data voltages to the data lines DTL. The data driver 210 may output the data voltages in synchronization with the display write signals. The pixels PX may be selected by the display write signals from the display scan driver 250, and the data voltages may be provided to the selected pixels PX.

The timing controller 220 may receive the digital video data DATA and timing signals from an external graphic device. For example, the external graphic device may be a graphic card of a computer or a set-top box, but embodiments are not limited thereto.

The timing controller 220 may generate the write control signal WCS, the initialization control signal ICS, the scan control signal CCS, and the emission control signal ECS to control the operation timing of the display scan driver 250 in accordance with the timing signals. For example, the timing controller 220 may generate a data control signal DCS to control the operation timing of the data driver 210 in accordance with the timing signals.

The timing controller 220 may output the write control signal WCS, the initialization control signal ICS, the scan control signal CCS, and the emission control signal ECS to the display scan driver 250. The timing controller 220 may output the digital video data DATA and the data control signal DCS to the data driver 210.

The power supply unit 230 may generate a plurality of driving voltages and may output the generated driving voltages to the display area DA. The power supply unit 230 may output a first driving voltage VDD, a second driving voltage VSS, and a third driving voltage VINT to the display panel PNL. The first driving voltage VDD may be a high-potential driving voltage, the second driving voltage VSS may be a low-potential driving voltage, and the third driving voltage VINT may be a voltage for initializing the gate electrodes of driving transistors of the pixels PX.

FIG. 4 is a schematic diagram of an equivalent circuit of a pixel according to an embodiment.

Referring to FIG. 4, a pixel PX may be connected to a k-th display initialization line GILk, a k-th display write line GWLk, and a k-th display control line GCLk, where k is a positive integer. The pixel PX may be connected to a first driving voltage line VDL, to which the first driving voltage VDD is provided, a second driving voltage line VSL, to which the second driving voltage VSS is provided, and a third driving voltage line VIL, to which the third driving voltage VINT is provided.

A pixel circuit PXC may include a driving transistor DT, a light-emitting element ED, switching elements, and a capacitor CST1. The switching elements include first, second, third, fourth, fifth, and sixth transistors ST1 to ST6.

The driving transistor DT may include a gate electrode, a first electrode, and a second electrode. The driving transistor DT may control a drain-source current (hereinafter, referred to as the driving current Ids), which flows between the first and second electrodes of the driving transistor DT in accordance with a data voltage applied to the gate electrode of the driving transistor DT. The driving current Ids, which flows through the channel of the driving transistor DT, may be proportional to the square of the difference between a threshold voltage and a gate-source voltage Vsg, which is the voltage between the first electrode and the gate electrode of the driving transistor DT, as indicated by Equation (1):

$$Ids = k' \times (Vsg - Vth)^2 \qquad (1)$$

where k' denotes a proportional coefficient determined by the structure and the physical characteristics of the driving transistor DT, Vsg denotes the voltage between the first electrode and the gate electrode of the driving transistor DT, and Vth denotes the threshold voltage of the driving transistor DT.

A light-emitting element ED may emit light in accordance with the driving current Ids. As the driving current Ids increases, the amount of light emitted by the light-emitting element ED may increase.

The light-emitting element ED may be an organic light-emitting diode (OLED) including an organic light-emitting layer disposed between the anode and the cathode thereof. In another example, the light-emitting element ED may be an inorganic light-emitting element including an inorganic semiconductor disposed between the anode and the cathode thereof. In another example, the light-emitting element ED may be a quantum-dot light-emitting element including a quantum-dot light-emitting layer disposed between the anode and the cathode thereof. In another example, the light-emitting element ED may be a micro-light-emitting element including a micro-LED.

The anode of the light-emitting element ED may be connected to the first electrode of the fourth transistor ST4 and the second electrode of the sixth transistor ST6, and the cathode of the light-emitting element ED may be connected to the second driving voltage line VSSL. A parasitic capacitor Cel may be formed between the anode and the cathode of the light-emitting element ED.

The first transistor ST1 may be turned on by an initialization scan signal from the k-th display initialization line GILk to connect the gate electrode of the driving transistor DT to the third driving voltage line VIL. As a result, the third driving voltage VINT from the third driving voltage line VIL may be applied to the gate electrode of the driving transistor DT. The gate electrode of the first transistor ST1 may be connected to the k-th display initialization line GILk, the first electrode of the first transistor ST1 may be connected to the gate electrode of the driving transistor DT, and the second electrode of the first transistor ST1 may be connected to the third driving voltage line VIL.

The second transistor ST2 may be turned on by a display write signal from the k-th display write line GWLk to connect the first electrode of the driving transistor DT to a j-th data line Dj. As a result, a data voltage from the j-th data line Dj may be applied to the first electrode of the driving transistor DT. The gate electrode of the second transistor ST2 may be connected to the k-th display write line GWLk, the first electrode of the second transistor ST2 may be connected to the first electrode of the driving transistor DT, and the second electrode of the second transistor ST2 may be connected to the j-th data line Dj.

The third transistor ST3 may be turned on by a display write signal from the k-th display write line GWLk to connect the gate electrode and the second electrode of the driving transistor DT. In case that the gate electrode and the second electrode of the driving transistor DT are connected, the driving transistor DT may operate as a diode. The gate electrode of the third transistor ST3 may be connected to the k-th display write line GWLk, the first electrode of the third transistor ST3 may be connected to the second electrode of the driving transistor DT, and the second electrode of the third transistor ST3 may be connected to the gate electrode of the driving transistor DT.

The fourth transistor ST4 may be turned on by a display control signal from the k-th display control line GCLk to connect the anode of the light-emitting element ED to the third driving voltage line VIL. The third driving voltage VINT from the third driving voltage line VIL may be applied to the anode of the light-emitting element ED. The gate electrode of the fourth transistor ST4 may be connected to the k-th display control line GCLk, the first electrode of the fourth transistor ST4 may be connected to the anode of the light-emitting element ED, and the second electrode of the fourth transistor ST4 may be connected to the third driving voltage line VIL.

The fifth transistor ST5 may be turned on by an emission signal from the k-th emission line Elk to connect the first electrode of the driving transistor DT to the first driving voltage line VDL. The gate electrode of the fifth transistor ST5 may be connected to the k-th emission line Elk, the first electrode of the fifth transistor ST5 may be connected to the first driving voltage line VDL, and the second electrode of the fifth transistor ST5 may be connected to the first electrode of the driving transistor DT.

The sixth transistor ST6 may be disposed between the second electrode of the driving transistor DT and the anode of the light-emitting element ED. The sixth transistor ST6 may be turned on by an emission control signal from the k-th emission line Elk to connect the second electrode of the driving transistor DT to the anode of the light-emitting element ED. The gate electrode of the sixth transistor ST6 may be connected to the k-th emission line Elk, the first electrode of the sixth transistor ST6 may be connected to the second electrode of the driving transistor DT, and the second electrode of the sixth transistor ST6 may be connected to the anode of the light-emitting element ED.

In case that the fifth and sixth transistors ST5 and ST6 are both turned on, the driving current Ids of the driving transistor DT may flow into the light-emitting element ED in accordance with the data voltage applied to the gate electrode of the driving transistor DT.

A capacitor CST1 may be connected between the gate electrode of the driving transistor DT and the first driving voltage line VDL. The first capacitor electrode of the capacitor CST1 may be connected to the gate electrode of the driving transistor DT, and the second capacitor electrode of the capacitor CST1 may be connected to the first driving voltage line VDL.

In a case where the first electrodes of the first to sixth transistors ST1 to ST6 and the driving transistor DT are source electrodes, the second electrodes of the first to sixth transistors ST1 to ST6 and the driving transistor DT may be drain electrodes. In another example, in a case where the first electrodes of the first to sixth transistors ST1 to ST6 and the driving transistor DT are drain electrodes, the second electrodes of the first to sixth transistors ST1 to ST6 and the driving transistor DT may be source electrodes. The first electrodes and the second electrodes of the first to sixth transistors ST1 to ST6 and the driving transistor DT may be referred to as source electrodes and drain electrodes according to the movement direction of multiple carriers in semiconductor layers of the first to sixth transistors ST1 to ST6 and the driving transistor DT. The first electrodes and the second electrodes of the first to sixth transistors ST1 to ST6 and the driving transistor DT may be referred to as a source electrode and a drain electrode, for example, as a first source electrode, a first drain electrode, a second source electrode and a second drain electrode.

Active layers of the first to sixth transistors ST1 to ST6 and the driving transistor DT may be formed of one of polysilicon, amorphous silicon, and an oxide semiconductor. FIG. 4 illustrates that the first to sixth transistors ST1 to ST6 and the driving transistor DT are P-type metal-oxide-semiconductor field-effect transistors (MOSFETs), but embodiments are not limited thereto. In another example, the first to sixth transistors ST1 to ST6 and the driving transistor DT may be formed as N-type MOSFETs. In another example, at least one of the first to sixth transistors ST1 to ST6 and the driving transistor DT may be formed as an N-type MOSFET.

The pixel circuit PXC has a "7T-1C" structure consisting of seven transistors and one capacitor, but the numbers of transistors and capacitors that form the pixel circuit PXC may vary.

Referring to FIGS. 3 and 4, the anodes of light-emitting elements ED may be separate between pixels PX and may be provided as pixel electrodes connected to different driving transistors DT to receive voltages and/or currents, but the cathodes of the light-emitting elements ED may be provided as a common electrode connected throughout without regard the pixels PX. The common electrode may be a whole-surface electrode disposed on the entire surface of the first substrate SUB1 of FIG. 2. The common electrode may receive the second driving voltage VSS from a second driving voltage line VSL.

In some embodiments, a plurality of first driving voltage lines VDL or a plurality of third driving voltage lines VIL may extend across the display area DA to be connected to pixel circuits PXC, but the second driving voltage line VSL may extend along the non-display area NDA around the display area DA. The common electrode may expand into the non-display area NDA to overlap at least partially the second driving voltage line VSL. The common electrode may be electrically connected to the second driving voltage line VSL through, for example, a contact hole, in an area where the common electrode and the second driving voltage line VSL overlap each other, and may thus receive the second driving voltage VSS. However, as the common electrode is connected to the second driving voltage line VSL only in the non-display area NDA, the magnitude of the second driving voltage VSS may decrease away from the second driving voltage line VSL, i.e., a voltage drop (e.g., IR drop) may occur, due to the resistance of the common electrode. The voltage drop may occur in other lines than the second driving voltage line VSL, but in a case where the common electrode requires transparency, a transparent conductive material (e.g., indium tin oxide (ITO)) that may be used to form the common electrode may have a higher resistance than the other lines, and thus, such voltage drop may become more apparent in the second driving voltage line VSL.

As will be described below, auxiliary electrodes may be further provided to reduce a voltage drop in the common electrode. The auxiliary electrodes may be electrically connected to the common electrode to reduce the resistance of the common electrode. A voltage drop in the common electrode may be considerably reduced by providing the second driving voltage VSS directly to the auxiliary electrodes. However, although the second driving voltage VSS is not provided to the auxiliary electrodes, the resistance of the common electrode may be reduced simply by electrically connecting the auxiliary electrodes to the common electrode, and thus, a voltage drop phenomenon may be reduced.

The auxiliary electrodes may extend across the display area DA and may be electrically connected to the common electrode, in the display area DA. Accordingly, the resistance of the common electrode may be reduced in the display area DA where voltage drops readily occur because of the distance from the second driving voltage line VSL, which is disposed in the non-display area NDA.

FIG. 5 is a schematic layout view of the display panel of the display device of FIG. 1. FIG. 5 illustrates the layout of the display write lines GWL, the data lines DTL, the first driving voltage line VDL, the second driving voltage line VSL, and auxiliary electrodes AUE.

Referring to FIG. 5, a pad area PDA may be provided in a portion of the non-display area NDA adjacent to the first short side SS1 of the first substrate SUB1. A plurality of pad electrodes may be disposed in the pad area PDA. The pad electrodes may include a plurality of data pads DTL_PD, at least one first driving voltage pad VDL_PD, and at least one second driving voltage pad VSL_PD.

The data lines DTL may be connected to the data pads DTL_PD and may extend into the display area DA. The data lines DTL may extend in the first direction DR1 and may be disposed between columns of pixels PX. The data lines DTL may be connected to a plurality of pixel circuits PXC, which are arranged along the direction in which the data lines DTL extend. A single data line DTL may be disposed between every two adjacent columns of pixels PX, but embodiments are not limited thereto. In another example, more than one data line DTL may be disposed in parallel between every two adjacent columns of pixels PX, but the data lines DTL may not be disposed between some certain columns of pixels PX.

The first driving voltage line VDL may be connected to the first driving voltage pad VDL_PD. The first driving voltage line VDL may include a stem line VDL_ST, which is connected to the first driving voltage pad VDL_PD, and a plurality of branch lines VDL_BR, which branch off of the stem line VDL_ST. The branch lines VDL_BR may be electrically connected to the stem line VDL_ST. The branch lines VDL_BR, like the data lines DTL, may extend in the second direction DR2 into the display area DA and may be disposed between the columns of pixels PX. The branch lines VDL_BR may be connected to the pixel circuits PXC, which are arranged along the direction in which the branch lines VDL_BR extend.

The second driving voltage line VSL may be connected to the second driving voltage pad VSL_PD. The second driving voltage line VSL may extend in the first direction DR1 in a portion of the non-display area NDA adjacent to the first long side LS1 and/or the second long side LS2. The second driving voltage line VSL may not enter the display area DA.

The auxiliary electrodes AUE extend in the first direction DR1. The auxiliary electrodes AUE may be disposed between the columns of pixels PX. A single auxiliary electrode AUE may be disposed between every two adjacent columns of pixels PX, but embodiments are not limited thereto. In another example, more than auxiliary electrode AUE may be disposed in parallel between every two adjacent columns of pixels PX. In another example, one auxiliary electrode AUE may be disposed between every two adjacent groups of columns of pixels PX.

The auxiliary electrodes AUE may not be directly connected to the pads provided in the pad area PDA. For example, the auxiliary electrodes AUE may be electrically connected to the common electrode, which is disposed above the auxiliary electrodes AUE. As the common electrode is electrically connected to the second driving voltage line VSL, the auxiliary electrodes AUE may be electrically connected to the second driving voltage pad VSL_PD through the common electrode and the second driving voltage line VSL.

The display write lines GWL may extend in the second direction DR2. In the display area DA, the display write lines GWL may intersect the data lines DTL, the first driving voltage line VDL, and the auxiliary electrodes AUE, but may be insulated from, rather than short-circuited with, the data lines DTL, the first driving voltage line VDL, and the auxiliary electrodes AUE because the display write lines GWL are formed of a different conductive layer from the data lines DTL, the first driving voltage line VDL, and the auxiliary electrodes AUE with an insulating film interposed therebetween.

The display scan driver 250 may be disposed to be adjacent to the first long side LS1 and/or the second long side LS2 of the display panel PNL. The display scan driver 250 may be a circuit formed on (e.g., directly on) the first substrate SUB1, but embodiments are not limited thereto. In another example, the display scan driver 250 may be provided as a chip and may be mounted on the first substrate SUB1.

The display scan driver 250 may be disposed on the outside of the second driving voltage line VSL, and the display write lines GWL may overlap and may intersect the second driving voltage line VSL. However, the layout of the display scan driver 250 and the second driving voltage line VSL is not limited.

FIG. 6 is a schematic cross-sectional view of a pixel of the display device of FIG. 1. FIG. 6 illustrates a pixel PX and an auxiliary electrode AUE adjacent to the pixel PX, and other pixels PX and other auxiliary electrodes AUE may have substantially the same structure and layout as the pixel PX and the auxiliary electrode AUE of FIG. 6. For example, the display area DA may have a structure in which the pixel PX and the auxiliary electrode AUE of FIG. 6 repeat.

For example, FIG. 6 illustrates a thin-film transistor (TFT), which is one of the driving transistor DT and the first to sixth transistors ST1 to ST6 of FIG. 4. For example, the thin-film transistor (TFT) of FIG. 6 may correspond to the driving transistor DT of FIG. 4. However, the thin-film transistor (TFT) of FIG. 6 may not be the driving transistor DT of FIG. 4, and the first to sixth transistors ST1 to ST6 of FIG. 4 may have substantially the same stack structure as the thin-film transistor (TFT) of FIG. 6 except for how they are connected to other elements of the pixel PX.

The structure of a pixel PX of the display device 1 will hereinafter be described with reference to FIG. 6.

Referring to FIG. 6, as already mentioned above, the first substrate SUB1 may be an insulating substrate or a semiconductor substrate. The first substrate SUB1 may be a rigid substrate. For example, the first substrate SUB1 may include glass.

A lower metal layer BML may be disposed on the first substrate SUB1. The lower metal layer BML may have a pattern shape and may overlap a semiconductor layer ACT thereabove to function as a light-blocking metal layer capable of preventing light from therebelow from being incident upon the semiconductor layer ACT. The lower metal layer BML may be electrically connected to an electrode of the thin-film transistor (TFT) of FIG. 6, for example, a drain electrode DE. In another example, the lower metal layer BML may be omitted.

A buffer layer BF may be disposed on the lower metal layer BML. The buffer layer BF may be formed on the entire surface of the first substrate SUB1. The buffer layer BF may insulate the semiconductor layer ACT and the lower metal layer BML. The buffer layer BF may include silicon nitride, silicon oxide, or silicon oxynitride.

The semiconductor layer ACT may be disposed on the buffer layer BF. The buffer layer BF may overlap the lower metal layer BML in the thickness direction, i.e., in the third direction DR3. The semiconductor layer ACT may include a first region, a second region, and da channel region, which is between the first and second regions. The first and second regions may be source and drain regions, respectively, or vice versa.

The semiconductor layer ACT may include polycrystalline silicon. In another example, the semiconductor layer ACT may include monocrystalline silicon, low-temperature polycrystalline silicon, amorphous silicon, or an oxide semiconductor. The oxide semiconductor may include a binary compound ($AB_x$), a ternary compound ($AB_xC_y$), or a quaternary compound ($AB_xC_yD_z$) containing indium (In), zinc (Zn), gallium (Ga), tin (Sn), titanium (Ti), aluminum (Al), hafnium (Hf), zirconium (Zr), or magnesium (Mg). For example, the semiconductor layer ACT may include indium tin zinc oxide (ITZO) or indium gallium zinc oxide (IGZO).

A gate insulating layer GI may be disposed on the semiconductor layer ACT. The gate insulating layer GI may include a silicon compound or a metal oxide. For example, the gate insulating layer GI may include silicon oxide, silicon nitride, silicon oxynitride, aluminum oxide, tantalum oxide, hafnium oxide, zirconium oxide, or titanium oxide, and these materials may be used alone or in combination with one another. The gate insulating layer GI may be a single-layer film or a multilayer film including a stack of different materials.

The gate insulating layer GI may be disposed on a portion of the semiconductor layer ACT. For example, the gate insulating layer GI may be disposed on the channel region of the semiconductor layer ACT, but may expose the first and second regions. For example, the gate insulating layer GI may overlap the channel region, but may not overlap the first and second regions. The gate insulating layer GI may have substantially the same shape as a gate electrode GE, in a plan view.

In another example, the gate insulating layer GI may be disposed on the entire surface of the first substrate SUB1. For example, the gate insulating layer GI may cover the first and second regions of the semiconductor layer ACT and may include contact holes, which expose the first and second regions such that a source electrode SE and the drain electrode DE are in contact with the semiconductor layer ACT.

A gate conductive layer may be disposed on the gate insulating layer GI. The gate conductive layer may include the gate electrode GE. The gate conductive layer may include a scan line, which is connected to the gate electrode GE. For example, the display write lines GWL, the display initialization lines GIL, the display control lines GCL, and the emission lines ETL of FIG. 3 may be formed as the gate conductive layer.

The gate electrode GE may overlap at least partially the channel region of the semiconductor layer ACT. Accordingly, the gate electrode GE and the semiconductor layer ACT may form parts of the thin-film transistor (TFT) of FIG. 6. The thin-film transistor (TFT) may include the gate electrode GE and the semiconductor layer ACT.

The gate conductive layer may include at least one metal selected from among molybdenum (Mo), Al, platinum (Pt), palladium (Pd), silver (Ag), Mg, gold (Au), nickel (Ni), neodymium (Nd), iridium (Ir), chromium (Cr), calcium (Ca), Ti, tantalum (Ta), tungsten (W), and copper (Cu). For example, the gate conductive layer may be formed as a stack of Mo/MoN.

An interlayer insulating layer ILD may be disposed on the gate conductive layer. The interlayer insulating layer ILD may include at least one of an inorganic film, which includes an inorganic insulating material, an organic film, which includes an organic insulating material, and an organic-inorganic hybrid film, which includes an inorganic insulating material and an organic insulating material.

Examples of the inorganic insulating material may include silicon oxide, silicon nitride, silicon oxynitride, hafnium oxide, aluminum oxide, titanium oxide, tantalum oxide, and zinc oxide, and examples of the organic insulating material may include an acrylic resin, an epoxy resin, a phenolic resin, a polyamide resin, a polyimide resin, an unsaturated polyester resin, a polyphenylene resin, a polyphenylene sulfide resin, or benzocyclobutene (BCB).

The interlayer insulating layer ILD may have a structure in which at least two selected from the group consisting of a plurality of inorganic films, a plurality of organic films, and a plurality of organic-inorganic hybrid films are stacked. The interlayer insulating layer ILD is illustrated as a single inorganic film.

A data conductive layer may be disposed on the interlayer insulating layer ILD. The data conductive layer may include the source electrode SE, the drain electrode DE, and an auxiliary electrode AUE. The data conductive layer may further include the data lines DTL and the first driving voltage line VDL of FIG. 3. The data conductive layer may further include the second driving voltage line VSL and the third driving voltage line VIL.

The source and drain electrodes SE and DE may be electrically connected to the first and second regions of the semiconductor layer ACT through contact holes penetrating the interlayer insulating layer ILD. The drain electrode DE may be electrically connected to the lower metal layer BML through a contact hole penetrating the interlayer insulating layer ILD and the buffer layer BF.

The data conductive layer may include at least one selected from among Al, Mo, Pt, Pd, Ag, Mg, Au, Ni, Nd, Ir, Cr, Ca, Ti, Ta, W, and Cu.

The data conductive layer may be formed as a multilayer film. For example, the data conductive layer may include a main conductive layer and may further include one or more sub-conductive layers, which are disposed below and/or above the main conductive layer. For example, the data conductive layer may include a first sub-conductive layer, a main conductive layer, which is disposed on the first sub-conductive layer, a second sub-conductive layer, which is disposed on the main conductive layer, and a third sub-conductive layer, which is disposed on the second sub-conductive layer. The first sub-conductive layer may be a lower sub-conductive layer on the bottom surface (or lower surface) of the main conductive layer, the second sub-conductive layer may be an upper sub-conductive layer on the top surface (or upper surface) of the main conductive layer, and the third sub-conductive layer may be a sub-conductive layer on the top surface (or upper surface) of the second sub-conductive layer. A portion of the third sub-conductive layer may be a sacrificial layer to be etched away during the fabrication of the display device 1.

For example, the first sub-conductive layer of the data conductive layer may include a first conductive layer DEa of the drain electrode DE, a first conductive layer SEa of the source electrode SE, and a first conductive layer AUEa of the auxiliary electrode AUE, the main conductive layer may include a second conductive layer (or main conductive layer) DEb of the drain electrode DE, a second conductive layer (or main conductive layer) SEb of the source electrode SE, and a second conductive layer (or main conductive layer) AUEb of the auxiliary electrode AUE, the second sub-conductive layer may include a third conductive layer (or sub conductive layer) DEc of the drain electrode DE, a third conductive layer (or sub conductive layer) SEc of the source electrode SE, and a third conductive layer (or sub conductive layer) AUEc of the auxiliary electrode AUE, and the third sub-conductive layer may include a fourth conductive layer (or upper conductive layer) DEd of the drain electrode DE, a fourth conductive layer (or upper conductive layer) SEd of the source electrode SE, and a fourth conductive layer (or upper conductive layer) AUEd (of FIGS. 14 through 16) of the auxiliary electrode AUE.

The bottom surface (or lower surface) of the main conductive layer may be in contact with (e.g., in direct contact with) the top surface (or upper surface) of the first sub-conductive layer, the top surface (or upper surface) of the main conductive layer may be in contact with (e.g., in direct contact with) the bottom surface (or lower surface) of the second sub-conductive layer, and the top surface (or upper surface) of the second sub-conductive layer may be in contact with (e.g., in direct contact with) the bottom surface (or lower surface) of the third sub-conductive layer.

The first sub-conductive layer may function as a barrier for preventing impurities, ions, or moisture from, for example, the interlayer insulating layer ILD or other underlying structures from penetrating (or permeating) the main conductive layer. For example, the first sub-conductive layer may have greater adhesion than the main conductive layer with respect to the interlayer insulating layer ILD and may thus improve the adhesiveness of the data conductive layer.

The main conductive layer may be a conductive layer mainly for transmitting signals. For example, the main conductive layer may be formed of a material having a lower resistivity than materials of the first and second sub-conductive layers and may be thicker than the first and second sub-conductive layers.

The second sub-conductive layer may function as a barrier film and/or a capping film to protect the main conductive layer from impurities, ions, or moisture from structures above the main conductive layer or from chemicals for use in processes after the deposition of the main conductive layer.

The third sub-conductive layer may function as a sacrificial layer for forming an undercut in a via insulating layer VIA, by being etched together with a pixel electrode layer that will be described below, during the fabrication of the display device 1. The third sub-conductive layer may not be etched entirely, but only a portion of the third sub-conductive layer may be etched such that an undercut may be formed at a certain position in the via insulating layer VIA. This will be described below. A portion of the third sub-conductive layer that is not etched may remain on the second sub-conductive layer and may be thinner than the main conductive layer to concentrate a current in the main conductive layer.

In some embodiments, the main conductive layer may include Cu and may have a thickness of about 6000 Å, and the first and second sub-conductive layers may include Ti and have a thickness of about 2000 Å to about 3000 Å. However, embodiments are not limited thereto. For example, the main conductive layer and the third conductive layer may include Al, the first sub-conductive layer may include Ti, and the second sub-conductive layer may include a transparent conductive oxide (e.g., ITO). For example, the main conductive layer will hereinafter be described as including Cu, and the first and second sub-conductive layers will hereinafter be described as including Ti.

The first sub-conductive layer, the main conductive layer, the second sub-conductive layer, and the third sub-conductive layer may have substantially the same pattern shape in a plan view. For example, the first sub-conductive layer, the main conductive layer, the second sub-conductive layer, and the third sub-conductive layer may have substantially the same pattern size or may have slightly different pattern sizes, but may extend in the same shape in a plan view.

In a cross-sectional view taken in the width direction of the data conductive layer, the side surfaces of the first sub-conductive layer, the side surfaces of the main conductive layer, and the side surfaces of the second sub-conductive layer may be aligned with one another. For example, the first sub-conductive layer, the main conductive layer, and the second sub-conductive layer may not overlap (e.g., completely overlap) one another in a plan view.

For example, in a case where the side surfaces of each of the source and drain electrodes SE and DE are inclined at an acute angle, the first, second, third, and fourth conductive layers SEa, SEb, SEc, and SEd may be understood as being aligned with one another in case that the side surfaces of each of the first, second, third, and fourth conductive layers SEa, SEb, SEc, and SEd fall on the inclined side surfaces of the source electrode SE. For example, the first, second, third, and fourth conductive layers DEa, DEb, DEc, and DEd may be understood as being aligned with one another in case that the side surfaces of each of the first, second, third, and fourth conductive layers DEa, DEb, DEc, and DEd fall on the inclined side surfaces of the drain electrode DE.

The data lines DTL, the first driving voltage line VDL, and the second driving voltage line VSL may have the same cross-sectional shape as the source and drain electrodes SE and DE.

The auxiliary electrode AUE may have a cross-sectional structure with side surfaces substantially aligned. The auxiliary electrode AUE, unlike the source or drain electrode SE or DE, may not include a fourth conductive layer. For example, the side surfaces of each of the first, second, and third conductive layers AUEa, AUEb, and AUEc of the auxiliary electrode AUE may be aligned, and the top surface (or upper surface) of the third conductive layer AUEc may be exposed by the via insulating layer VIA because the pixel electrode layer is etched together with the fourth conductive layer AUEd during the fabrication of the display device 1. This will be described below.

For example, another conductive layer may be further disposed between the lower metal layer BML and the data conductive layer.

The gate conductive layer may be referred to as a first gate conductive layer, and a second gate conductive layer, which may be used as a capacitor second electrode, may be further disposed between the first gate conductive layer and the data conductive layer. In a case where the display panel PNL includes heterogeneous transistors such as polysilicon transistors and oxide semiconductor transistors, a third gate conductive layer may be further disposed above or below the first gate conductive layer, which is used as the gate electrodes of the polysilicon transistors. For example, the second gate conductive layer and/or the third gate conductive layer may have the same stack structure as the first gate conductive layer. Gate conductive layers other than the first, second, and third gate conductive layers may be further provided.

For example, the data conductive layer may be referred to as a first data conductive layer, and other conductive layers, which function as wiring or electrodes, may be further disposed between the first data conductive layer and the gate conductive layer. For example, in a case where a second data conductive layer and/or a third data conductive layer are disposed between the first data conductive layer and the gate conductive layer, the data lines DTL, the source electrode SE, the drain electrode DE, the first driving voltage line VDL, the second driving voltage line VSL, and the third driving voltage line VIL may be formed of one of the first, second, and third data conductive layers. For example, the auxiliary electrode AUE may be formed as the first data conductive layer, which is the uppermost data conductive layer. Data conductive layers other than the first, second, and third data conductive layers may be further provided.

The via insulating layer VIA (or an organic insulating film) may be disposed on the data conductive layer. The via insulating layer VIA may have a flat top surface (or flat upper surface). The via insulating layer VIA may include a via opening OP2, which exposes the top surface (or upper surface) of the third conductive layer AUEc of the auxiliary electrode AUE. The via opening OP2 may include first and second opening parts OP2a and OP2b, which form an undercut shape. The shape of the undercut will be described below with reference to FIG. 7.

The via insulating layer VIA may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene (BCB).

The pixel electrode layer may be disposed on the via insulating layer VIA. The pixel electrode layer may include a pixel electrode PXE. The pixel electrode PXE may be disposed in each pixel PX. The pixel electrode PXE may be electrically connected to the drain electrode DE through a contact hole CTH (or a via hole) penetrating (or formed in) the via insulating layer VIA. The pixel electrode PXE may function as the anode of a light-emitting element ED.

The pixel electrode PXE may not overlap the auxiliary electrode AUE due to the selective etching of the pixel electrode layer, and this will be described below.

In some embodiments, the pixel electrode layer may have a structure in which a layer of a material with a high work function such as ITO, indium zinc oxide (IZO), zinc oxide (ZnO), or indium oxide ($In_2O_3$) and a layer of a reflective material such as Ag, Mg, Al, Pt, lead (Pb), Au, Ni, Nd, Jr, Cr, lithium (Li), Ca, or a mixture thereof are stacked, but embodiments are not limited thereto. For example, the layer of the material with a high work function may be disposed above the material of the reflective material, close to a middle layer EL that will be described below. In some embodiments, the pixel electrode layer may have a multi-layer structure of, for example, ITO/Mg, ITO/MgF, ITO/Ag, or ITO/Ag/ITO, but embodiments are not limited thereto.

A pixel-defining film PDL may be disposed on the pixel electrode PXE and the via insulating layer VIA. The pixel-defining film PDL may define an emission area. The pixel-defining film PDL may include a first opening OP1a, which exposes at least a portion of the pixel electrode PXE. The pixel-defining film PDL may further include a second opening OP1b, which exposes the top surface (or upper surface) of the third conductive layer AUEc of the auxiliary electrode AUE.

The second opening OP1b of the pixel-defining film PDL may overlap the via opening OP2 of the via insulating layer VIA. For example, as the second opening OP1b of the pixel-defining film PDL overlaps a portion of the via opening OP2 that exposes the top surface of the third conductive layer AUEc of the auxiliary electrode AUE, the top surface (or upper surface) of the third conductive layer AUEc of the auxiliary electrode AUE may be exposed by the via opening OP2.

The pixel-defining film PDL may include an organic insulating material such as an acrylic resin, an epoxy resin, a phenolic resin, a polyamide resin, a polyimide resin, an unsaturated polyester resin, a polyphenylene resin, a poly-phenylene sulfide resin, or benzocyclobutene (BCB). In another example, the pixel-defining film PDL may include an inorganic material. In another example, the pixel-defining film may include a stack of an inorganic layer and an organic layer.

The middle layer EL may be disposed on the pixel-defining film PDL. The middle layer EL may include a hole injection/transport layer, which is disposed below the organic light-emitting layer, or an electron injection/trans-port layer, which is disposed above the organic light-emit-ting layer. The hole injection/transport layer and/or the electron injection/transport layer may have the same shape as the organic light-emitting layer in a plan view, but embodiments are not limited thereto.

The middle layer EL may cover the entire display area DA of the display panel PNL in a plan view. For example, the middle layer EL may cover the first opening OP1a, which is formed by the pixel-defining film PDL, and may be discon-nected by the second opening OP1b and the via opening OP2. A dummy part EDL may be disposed on the top surface of the third conductive layer AUEc of the auxiliary electrode AUE, which is exposed by the second opening OP1b and the via opening OP2, and may be formed of the same layer as the middle layer EL. The dummy part EDL may be formed due to the undercut shape of the via opening OP2 formed in the via insulating layer VIA, and this will be described below.

The middle layer EL may emit light by being in contact with a portion of the top surface (or upper surface) of the pixel electrode PXE exposed by the first opening OP1 of the pixel-defining film PDL. FIG. 6 illustrates two parts of the middle layer EL, which are disconnected from each other by the second opening OP1b of the pixel-defining film PDL, i.e., a left portion of the middle layer EL is in contact with the pixel electrode PXE of the pixel PX of FIG. 6 and a right portion of the middle layer EL in contact with a pixel electrode PXE of a neighboring pixel PX adjacent to the pixel PX of FIG. 6. For example, a portion of the middle layer EL that is in contact with the top surface (or upper surface) of the pixel electrode PXE will hereinafter be referred to as a light-emitting middle layer part, and the light-emitting middle layer part may define the emission area of the light-emitting element ED.

The dummy part EDL may be disposed on the top surface (or upper surface) of the auxiliary electrode AUE and may be separated from the middle layer EL. As the middle layer EL is electrically connected to the pixel electrode PXE of a pixel PX, the other pixels PX may be prevented from accidentally (or unintentionally) emitting light.

A common electrode layer may be disposed on the middle layer EL. In some embodiments, the common electrode layer may include a layer of a material with a low work function such as Li, Ca, LiF/Ca, LiF/Al, Al, Mg, Ag, Pt, Pd, Ni, Au Nd, Ir, Cr, BaF, Ba, or a compound or mixture thereof (e.g., the mixture of Ag and Mg), but embodiments are not limited thereto. The common electrode layer may further include a transparent metal oxide layer, which is disposed on the layer of the material with a low work function.

The common electrode layer may cover the middle layer EL. For example, the common electrode layer may cover the entire display area DA of the display panel PNL in a plan view. The common electrode layer may include a common electrode CE, which is in contact with the light-emitting middle layer part in the first opening OP1a formed by the pixel-defining film PDL, and a dummy common electrode CDE, which is separate from the common electrode CE and is disposed on the dummy part EDL of the middle layer EL.

FIG. 6 illustrates two parts of a common electrode CE, i.e., a left portion of the common electrode CE on the left side of the second opening OP1b of the pixel-defining film PDL and a right portion of the common electrode CE on the right side of the second opening OP1b of the pixel-defining film PDL. The left portion of the common electrode CE may be in contact with a light-emitting middle layer portion of the pixel PX of FIG. 6, and the right portion of the common electrode CE may be in contact with a light-emitting middle layer portion of the neighboring pixel PX. The common electrode CE may function as the cathode of the light-emitting element ED.

The common electrode CE may cover the sidewalls of the second opening OP1b, which is formed in the pixel-defining film PDL, and the sidewalls of the via opening OP2, which is formed in the via insulating layer VIA. For example, the common electrode CE may be in contact with at least a portion of the top surface of the third conductive layer AUEc of the auxiliary electrode AUE beyond the second opening OP1b and the via opening OP2. As a result, the common electrode CE may be electrically connected to each other via the auxiliary electrode AUE. The auxiliary electrode AUE, which is formed of the data conductive layer, may include a material with a lower resistance than the common electrode CE. As the common electrode CE is electrically connected to the auxiliary electrode AUE, which includes a material with a relatively low resistance, voltage drops in the common electrode CE may be reduced.

The auxiliary electrode AUE and layers around the auxiliary electrode AUE will hereinafter be described.

FIG. 7 is an enlarged cross-sectional view of an area A1 of FIG. 6.

Referring to FIG. 7, the auxiliary electrode AUE may include the first conductive layer AUEa, which is disposed on the interlayer insulating layer ILD, the second conductive layer AUEb, which is disposed on the first conductive layer AUEa, and the third conductive layer AUEc, which is disposed on the second conductive layer AUEb.

The bottom surface (or lower surface) of the second conductive layer AUEb may be in contact with (e.g., in direct contact with) the top surface (or upper surface) of the first conductive layer AUEa, and the top surface (or upper surface) of the second conductive layer AUEb may be in contact with (e.g., in direct contact with) the bottom surface (or lower surface) of the third conductive layer AUEc.

The first conductive layer AUEa may include at least one of Ti, Mo, and a conductive oxide and may have a thickness of about 200 Å. The second conductive layer AUEb may include at least one of Al and Cu and may have a thickness of about 6000 Å. The third conductive layer AUEc may include at least one of Ti, Mo, and a conductive oxide and may have a thickness of about 500 Å. For example, the first and third conductive layers AUEa and AUEc will hereinafter be described as including Ti, and the second conductive layer AUEb will hereinafter be described as including Cu.

Referring to FIGS. 6 and 7, a distance DIS between a bottom surface (or lower surface) of the first part VIAa of the via insulating layer VIA and the top surface (or upper surface) of the third conductive layer (or sub conductive layer) AUEc of the auxiliary electrode AUE may be substantially the same as a thickness TH of the fourth conductive layers (or upper conductive layers) SEd and DEd of the source electrode SE and the drain electrode DE. Further, a distance DIS between a bottom portion (or lower portion) of the first opening part OP2a of the via opening OP2 and the top surface (or upper surface) of the third conductive layer (or sub conductive layer) AUEc of the auxiliary electrode AUE may be substantially the same as a thickness of the fourth conductive layers (or upper conductive layers) SEd and DEd of the source electrode SE and the drain electrode DE.

The via insulating layer VIA may include a second part VIAb, which is in contact with the side surfaces of each of the first, second, and third conductive layers AUEa, AUEb, and AUEc of the auxiliary electrode AUE, and a first part VIAa, which is disposed on the second part VIAb and is spaced apart from the top surface (or upper surface) of the third conductive layer AUEc of the auxiliary electrode AUE in the third direction DR3.

The second part VIAb of the via insulating layer VIA may cover the side surfaces of the auxiliary electrode AUE so that the auxiliary electrode AUE may not be visible from the outside. As the side surfaces of the auxiliary electrode AUE are not exposed to the outside during the fabrication of the display device 1, the auxiliary electrode AUE may not be oxidized.

The side surfaces of the second part VIAb may have the same inclination as the side surfaces of the auxiliary electrode AUE. The side surfaces of the second part VIAb may include parts in contact with the side surfaces of the auxiliary electrode AUE and parts forming the sidewalls of the second opening part OP2b of the via opening OP2. For example, the second opening part OP2b of the via opening OP2, which is space formed by the second part VIAb of the via insulating layer VIA and the top surface of the third conductive layer AUEc of the auxiliary electrode AUE, may be defined as space occupied by a fourth conductive layer AUEd of the auxiliary electrode AUE' of FIGS. 14 through 16 during the fabrication of the display device 1.

The side surfaces of the second part VIAb may be inwardly inclined in the third direction DR3. Accordingly, the width of the second opening part OP2b of the via opening OP2 may decrease as moving in the third direction DR3 (or as being closer to pixel-defining film PDL).

The first part VIAa of the via insulating layer VIA may be disposed on the second part VIAb of the via insulating layer VIA and may be projected (or protruded) to face a portion of the top surface of the third conductive layer AUEc of the auxiliary electrode AUE. The side surfaces of the first part VIAa may form sidewalls that define the first opening part OP2a of the via opening OP2. The side surfaces of the first part VIAa may be outwardly inclined in the third direction DR3. Accordingly, the width of the first opening part OP2a of the via opening OP2 may increase as moving in the third direction DR3 (or as being closer to pixel-defining film PDL).

The via insulating layer VIA may have an undercut in which the side surfaces of the second part VIAb are on the inside of the side surfaces of the second part VIAb. For example, the via opening OP2, which is formed in the via insulating layer VIA, may include the second opening part OP2b, which exposes the entire top surface of the third conductive layer AUEc of the auxiliary electrode AUE, and the first opening part OP2a, which has a smaller width than the second opening part OP2b and exposes a portion of the top surface of the third conductive layer AUEc of the auxiliary electrode AUE.

The middle layer EL may extend to the first part VIAa of the via insulating layer VIA and may be disconnected by the first opening part OP2a of the via opening OP2. For example, the middle layer EL may not be disposed on the side surfaces of the second part VIAb of the via insulating layer VIA.

The dummy part EDL may be disposed on a portion of the top surface (or upper surface) of the third conductive layer AUEc of the auxiliary electrode AUE exposed by the first opening part OP2a of the via opening OP2, and may be formed of the same layer as the middle layer EL. During the formation of the middle layer EL in the entire display area DA, the middle layer EL may be disconnected due to the undercut formed by the via opening OP2, and as a result, the dummy part EDL may be formed (see FIGS. 17 and 18).

The dummy part EDL may form an island shape on the top surface (or upper surface) of the third conductive layer AUEc of the auxiliary electrode AUE. In some embodiments, the dummy part EDL may be disposed only on the portion of the top surface (or upper surface) of the third conductive layer AUEc exposed by the first opening part OP2a of the via opening OP2, but embodiments are not limited thereto. FIG. 7 illustrates that the dummy part EDL is disposed only on the portion of the top surface of the third conductive layer AUEc exposed by the first opening part OP2a of the via opening OP2.

The common electrode CE may cover the side surfaces of the second part VIAb of the via insulating layer VIA, beyond the first part VIAa of the via insulating layer VIA, and may be in contact with a portion of the top surface (or upper surface) of the third conductive layer AUEc of the auxiliary electrode AUE hidden by the first part VIAa of the via insulating layer VIA.

The dummy common electrode CDE, which is formed of the same layer as the common electrode CE, may cover the dummy part EDL and may form a pattern corresponding to the dummy part EDL. In some embodiments, the common electrode CE and the dummy common electrode CDE may be spaced apart from each other on the top surface (or upper surface) of the third conductive layer AUEc of the auxiliary electrode AUE and may form a non-contact part NCP where the common electrode layer is not disposed, on the top surface (or upper surface) of the third conductive layer AUEc of the auxiliary electrode AUE, on sides (e.g., opposite sides) of the dummy common electrode CDE, but embodiments are not limited thereto. The non-contact part NCP may or may not be formed according to the conditions for forming the common electrode layer. FIG. 7 illustrates that the common electrode CE and the dummy common electrode CDE are spaced apart from each other on the top surface (or upper surface) of the third conductive layer AUEc of the auxiliary electrode AUE.

As an undercut is not formed in the auxiliary electrode AUE and the side surfaces of the auxiliary electrode AUE, which is susceptible to oxidation, are covered by the first part VIAa of the via insulating layer VIA, the oxidation of the auxiliary electrode AUE may be prevented or at least alleviated.

The fabrication of the display device 1 will hereinafter be described.

FIGS. 8 through 18 illustrate a method of manufacturing a display device according to an embodiment.

Referring to FIGS. 8 through 18, the fabrication of the display device 1 may include: forming a preliminary data conductive layer DSL (S100); forming a via insulating layer VIA on the preliminary data conductive layer DSL (S200); forming a via opening OP2 in the via insulating layer VIA (S300); forming a pixel electrode layer PXL on the via insulating layer VIA (S400); and forming a pixel electrode PXE and an undercut in the via insulating layer VIA (S500) by etching a portion of the pixel electrode layer PXL and a portion of the preliminary data conductive layer DSL exposed by the via opening OP2.

Figure 9:
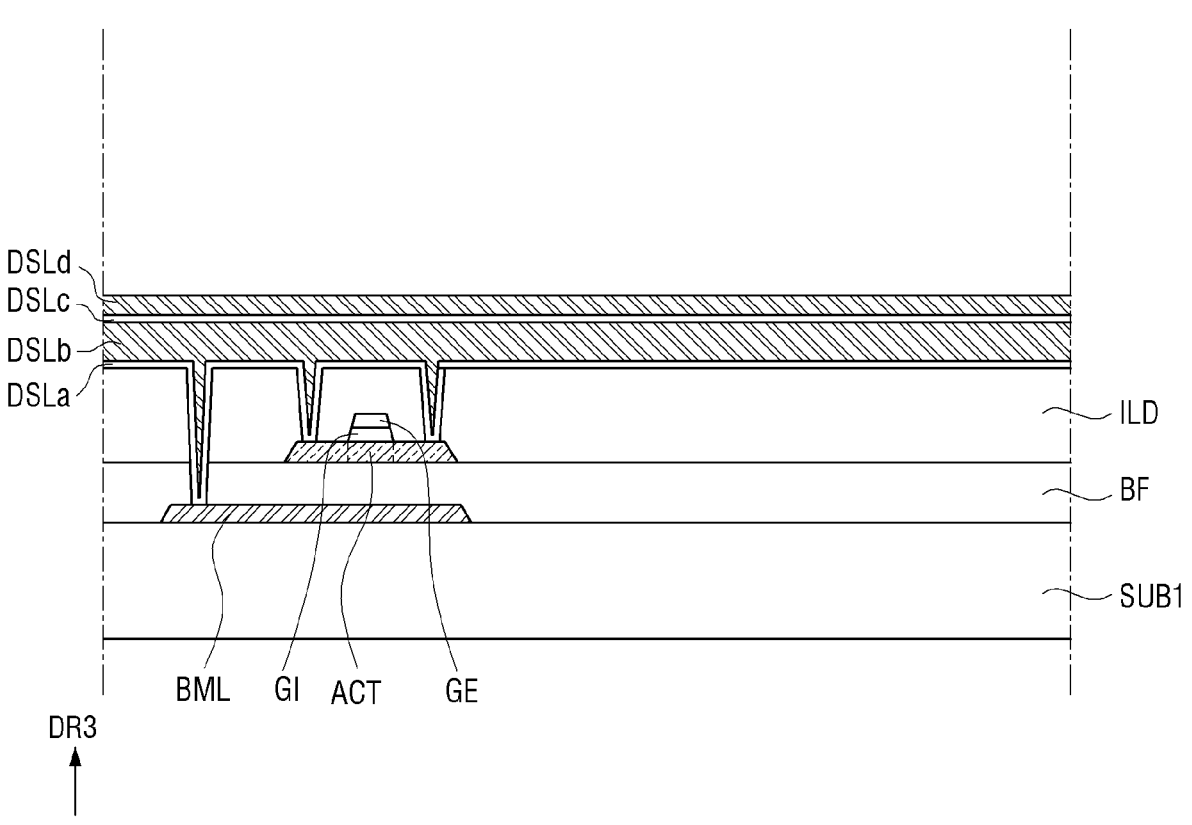
Figure 10:
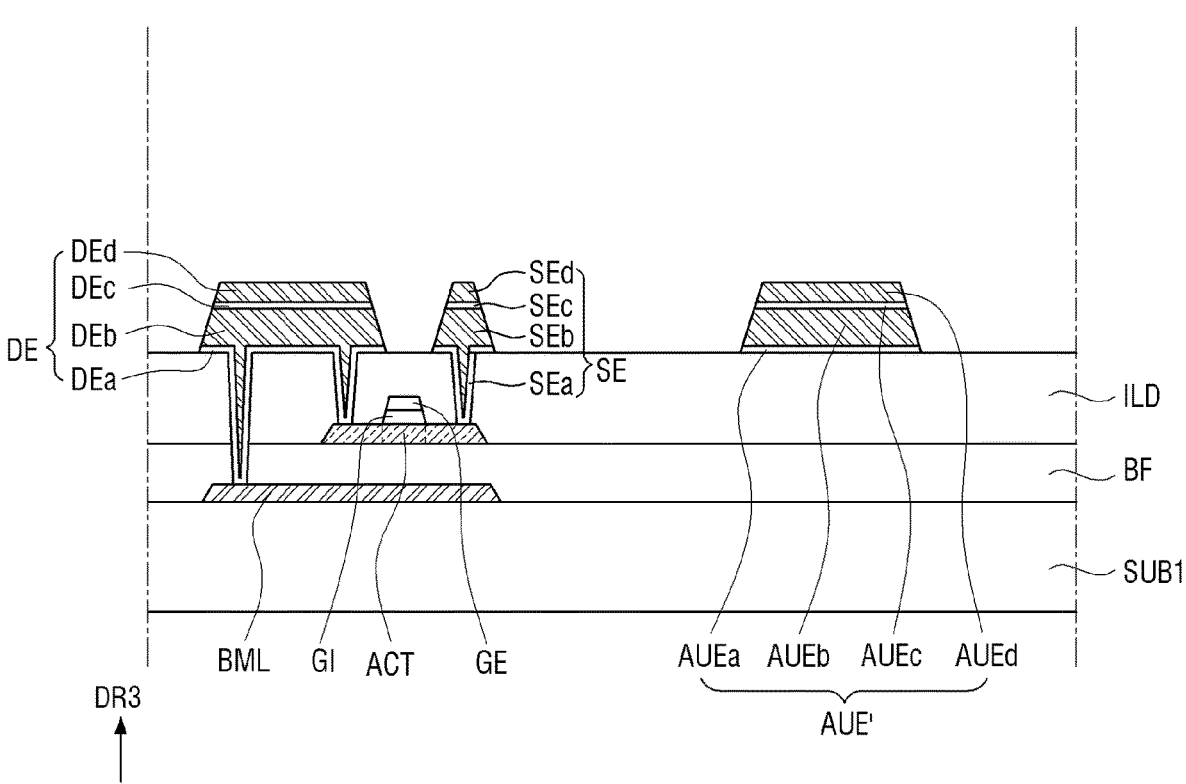

Referring to FIGS. 9 and 10, a first substrate SUB1 with the preliminary data conductive layer DSL formed on an interlayer insulating layer ILD may be prepared, and the preliminary data conductive layer DSL may include a source electrode SE, a drain electrode DE, and an auxiliary electrode AUE'. For example, the preliminary data conductive layer DSL may include a first preliminary data conductive layer DSLa disposed on the interlayer insulating layer ILD, a second preliminary data conductive layer DSLb disposed the first preliminary data conductive layer DSLa, a third preliminary data conductive layer DSLc disposed on the second preliminary data conductive layer DSLb, and a fourth preliminary data conductive layer DSLd disposed on the third preliminary data conductive layer DSLc. The auxiliary electrode AUE' may include first, second, third, and fourth conductive layers AUEa, AUEb, AUEc, and AUEd and refers to an auxiliary electrode with the fourth conductive layer AUEd yet to be etched.

The first substrate SUB1 with the preliminary data conductive layer DSL formed on the interlayer insulating layer ILD may be prepared as follows. A lower metal layer BML may be formed on the first substrate SUB1, and a buffer layer BF may be formed on the lower metal layer BML. Thereafter, a semiconductor layer ACT may be formed on the buffer layer BF, a gate insulating layer GI and a gate conductive layer may be formed on the semiconductor layer ACT, a gate electrode GE may be formed by patterning the gate conductive layer, and the gate insulating layer GI may be patterned using the gate electrode GE as an etching mask. Thereafter, the interlayer insulating layer ILD may be deposited, and contact holes, which expose the lower metal layer BML and first and second regions of the semiconductor layer ACT, may be formed. Thereafter, a first sub-conductive layer, which includes Ti, a main conductive layer, which includes Cu, a second sub-conductive layer, which includes Ti, and a third sub-conductive layer, which includes Cu, may be sequentially deposited, and the source electrode SE, the drain electrode DE, and the auxiliary electrode AUE' may be formed, as illustrated in FIG. 10, by patterning the first sub-conductive layer, the main conductive layer, the second sub-conductive layer, and the third sub-conductive layer. The side surfaces of each of the source electrode SE, the drain electrode DE, and the auxiliary electrode AUE' may be inclined at an acute angle, but embodiments are not limited thereto.

Figure 11:
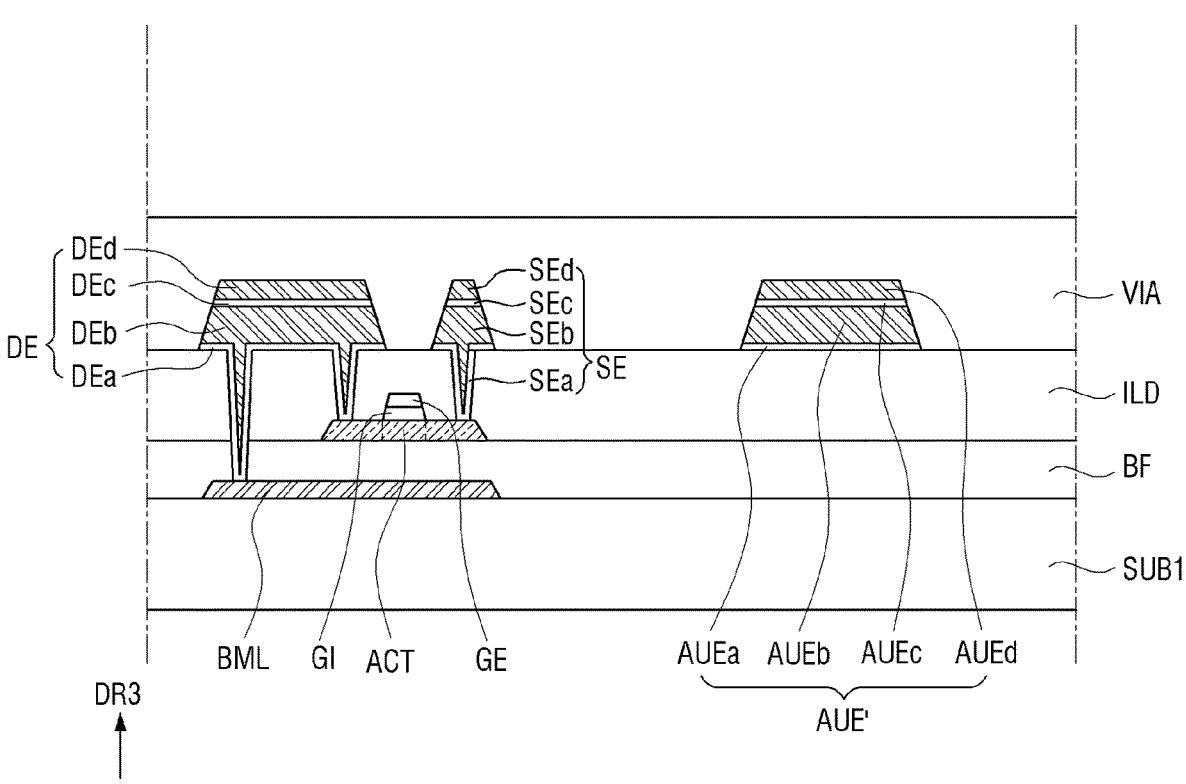
Figure 12:
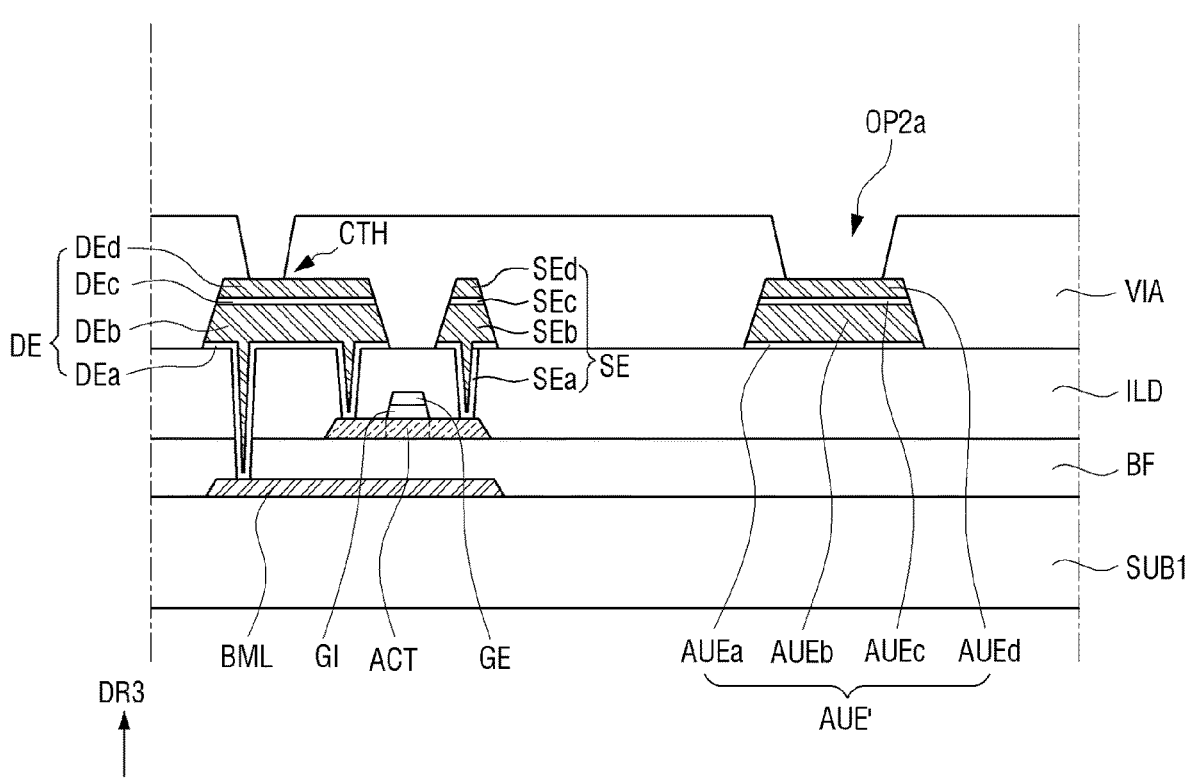

Thereafter, referring to FIGS. 11 and 12, the via insulating layer VIA may be formed by applying an organic material for forming the via insulating layer VIA on the preliminary data conductive layer DSL, and a first opening part OP2a of the via opening OP2 and a contact hole CTH in the via insulating layer VIA.

The first opening part OP2a of the via opening OP2 and the contact hole CTH may be formed in the via insulating layer VIA, as follows.

The via insulating layer VIA may be exposed to light. The via insulating layer VIA, which is disposed on the preliminary data conductive layer DSL, may include a positive photosensitive material. For example, the via insulating layer VIA may be dried and baked and may be exposed to light by using a light mask including light-transmitting areas and light-blocking areas. For example, the light-transmitting areas may be disposed to correspond to the first opening part OP2a of the via opening OP2 and the contact hole CTH, which exposes the drain electrode DE.

Thereafter, a developer process of applying a developer to the via insulating layer VIA may be performed. The developer may include a tetramethylammonium hydroxide (TMAH) solution. The concentration of TMAH in the developer is not limited, but may be in the range of 0.04% to 5%. As a result of the developer process, the exposed portion of the via insulating layer VIA may be selectively removed.

The via insulating layer VIA may cover the side surfaces of the auxiliary electrode AUE' and may be in contact with a portion of the top surface (or upper surface) of the fourth conductive layer AUEd of the auxiliary electrode AUE'. For example, the first opening part OP2a of the via opening OP2, which is formed in the via insulating layer VIA, may expose a portion of the top surface (or upper surface) of the fourth conductive layer AUEd of the auxiliary electrode AUE'.

Thereafter, the pixel electrode layer PXL may be formed on the via insulating layer VIA. The pixel electrode layer PXL may be formed by, for example, a sputtering process or a chemical vapor deposition (CVD) process.

Figure 13:
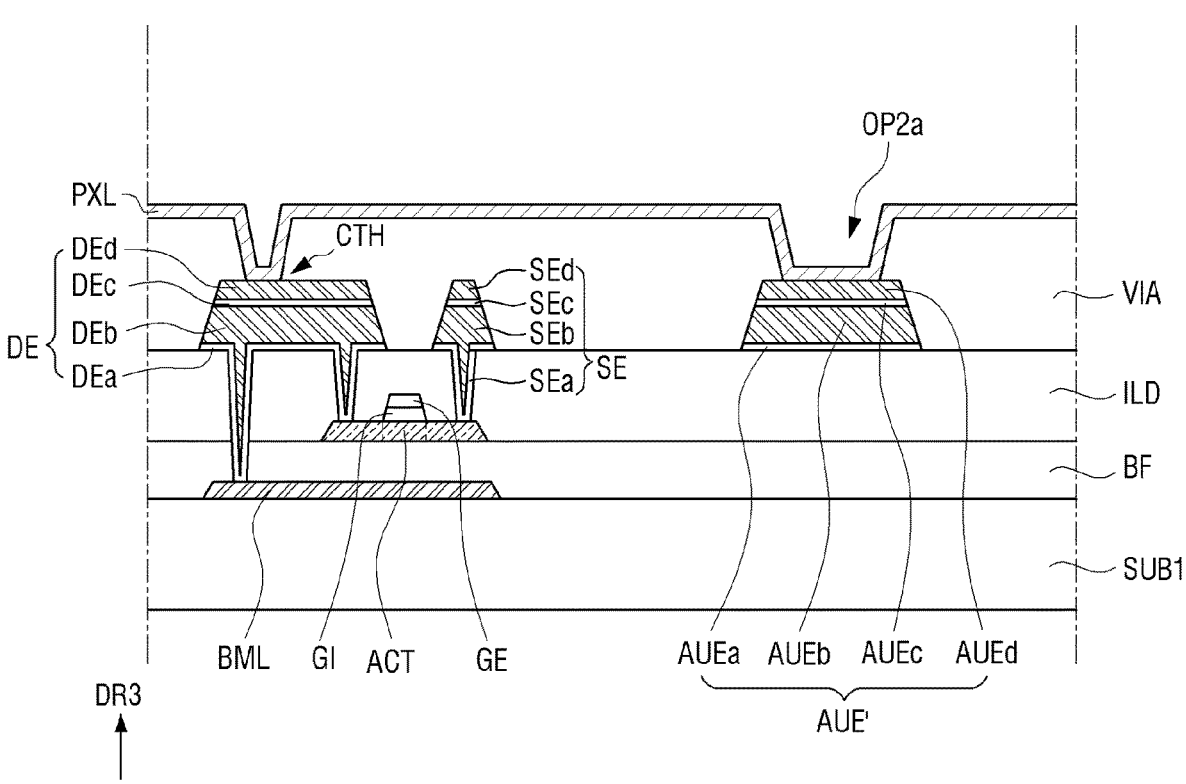

Referring to FIG. 13, the pixel electrode layer PXL may be formed to have substantially the same thickness along the profile of the via insulating layer VIA. The pixel electrode layer PXL may be in contact with a fourth conductive layer DEd of the drain electrode DE through the contact hole CTH, which is formed in the via insulating layer VIA, and may be in contact with the fourth conductive layer AUEd of the auxiliary electrode AUE' through the first opening part OP2a of the via opening OP2.

Figure 14:
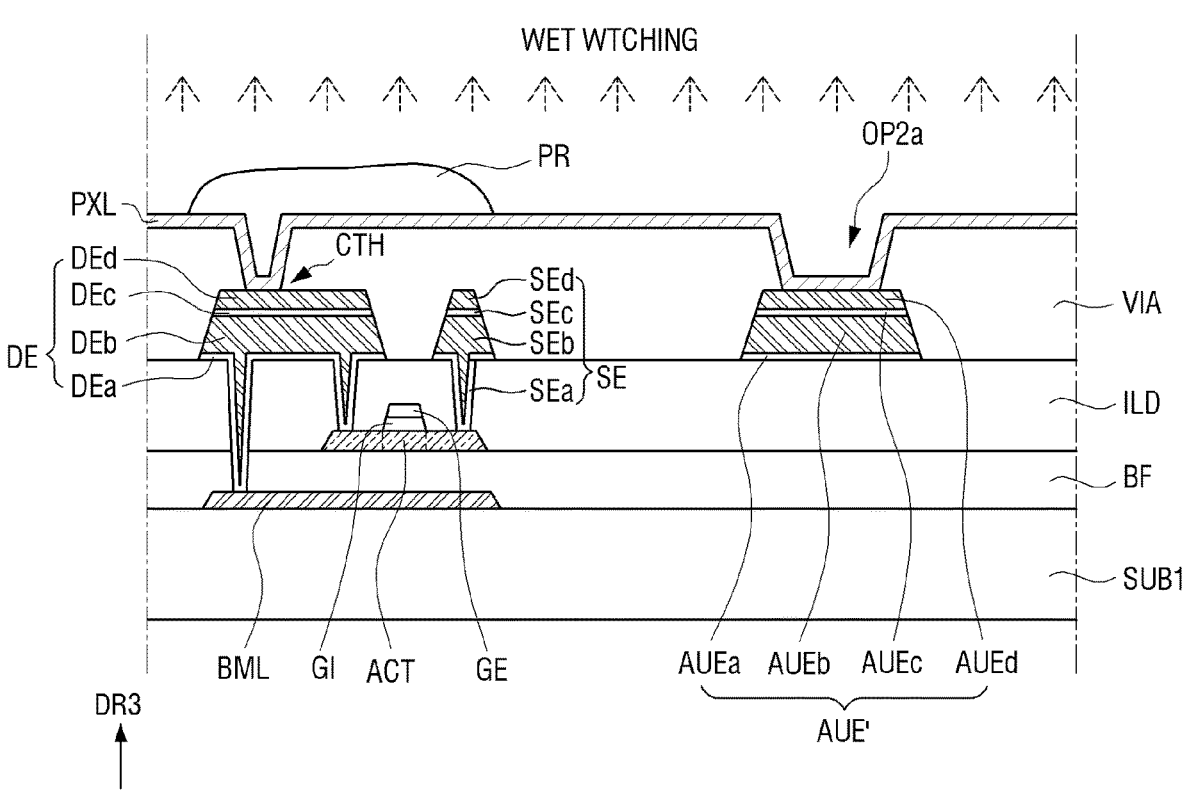
Figure 15:
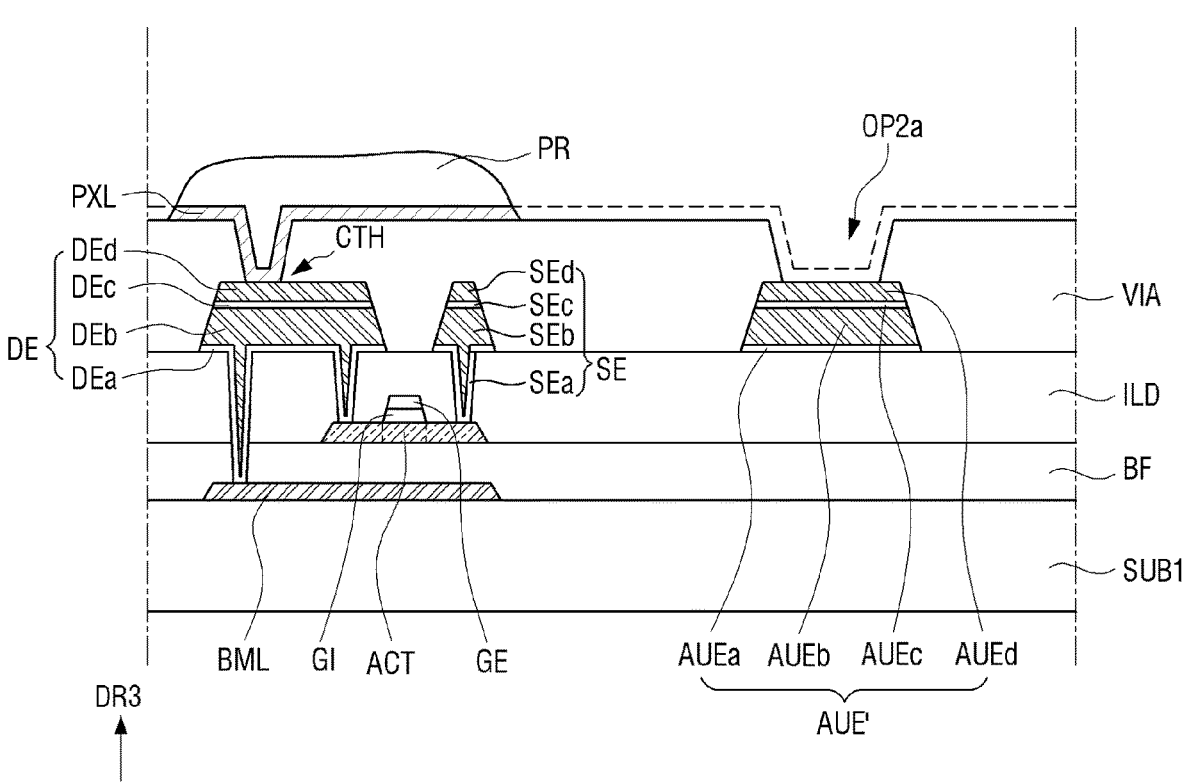
Figure 16:
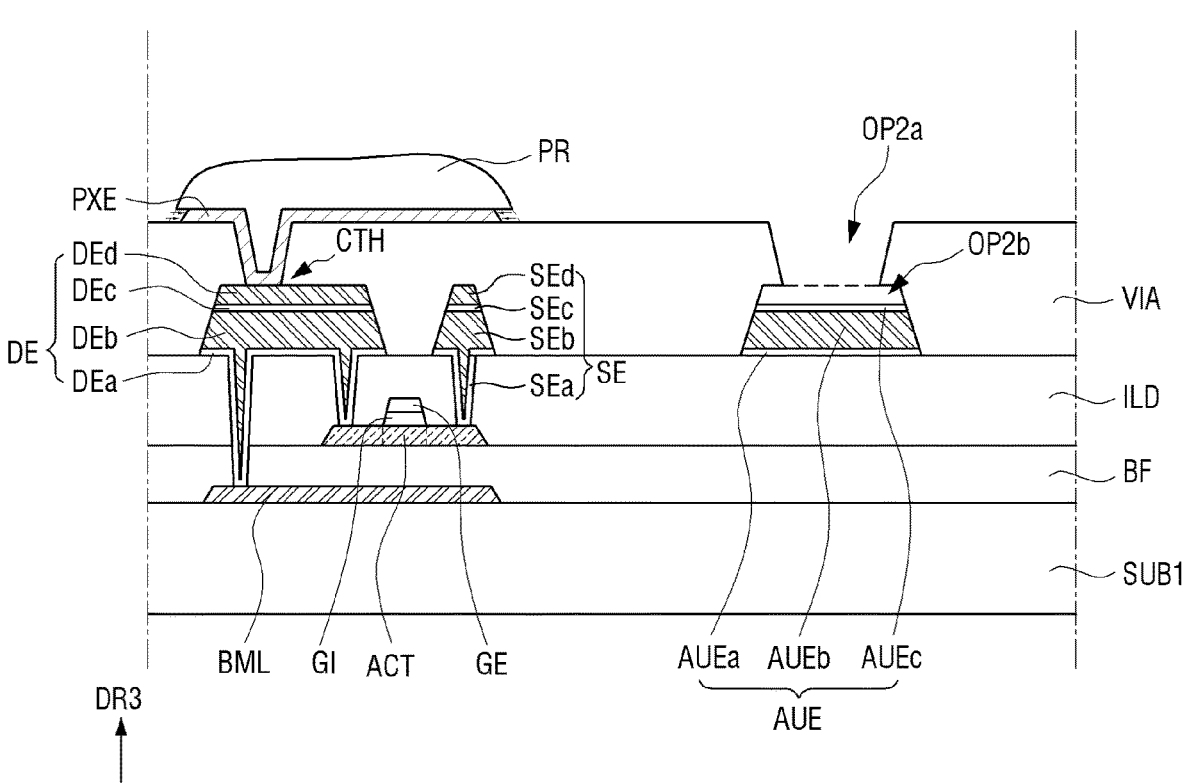

Thereafter, referring to FIGS. 14 through 16, the pixel electrode PXE may be formed by etching the pixel electrode layer PXL, and a second opening part OP2b of the via opening OP2 may be formed by etching the fourth conductive layer AUEd of the auxiliary electrode AUE' to form an undercut. The pixel electrode layer PXL and the fourth conductive layer AUEd of the auxiliary electrode AUE' may be etched by, for example, a wet etching process.

Referring to FIGS. 14 and 15, the pixel electrode PXE may be formed by forming a photoresist pattern PR on the entire pixel electrode layer PXL, except for a part to be etched, as an etching stopper film and by applying an etchant onto the part to be etched.

For example, about 50 seconds after the application of the etchant, the entire pixel electrode layer PXL except for a part that overlaps the photoresist pattern PR may be etched, and as a result, the top surface of the fourth conductive layer AUEd of the auxiliary electrode AUE' may be exposed by the first opening part OP2a of the via opening OP2. In some embodiments, the etchant may include an acetic acid-based material, but embodiments are not limited thereto.

Thereafter, in case that the etching of the pixel electrode layer PXL is continued with the etchant remained, the fourth conductive layer AUEd of the auxiliary electrode AUE' may be additionally etched, thereby forming the second opening part OP2b of the via opening OP2. For example, in case that the etchant is left for about one to two seconds, the fourth conductive layer AUEd of the auxiliary electrode AUE' may react with the etchant and may thus be etched (e.g., completely etched) away, and the third conductive layer AUEc of the auxiliary electrode AUE' may not react with the etchant and may thus not be etched. As the side surfaces of the second conductive layer AUEb, which includes the same material as the fourth conductive layer AUEd, are covered by the via insulating layer VIA, the etchant may not be able to penetrate the second conductive layer AUEb, and as a result, the second conductive layer AUEb may remain intact.

Thus, the second opening part OP2b of the via opening OP2 may be substantially the same as the space occupied by the fourth conductive layer AUEd of the auxiliary electrode AUE'. Accordingly, a via opening OP2 having an undercut may be formed in the via insulating layer VIA.

As an etching process is additionally performed, a portion of the pixel electrode layer PXL below the photoresist pattern PR may be additionally etched, thereby forming the pixel electrode PXE. For example, the pixel electrode PXE may form an undercut with the photoresist pattern PR yet to be removed.

Figure 17:
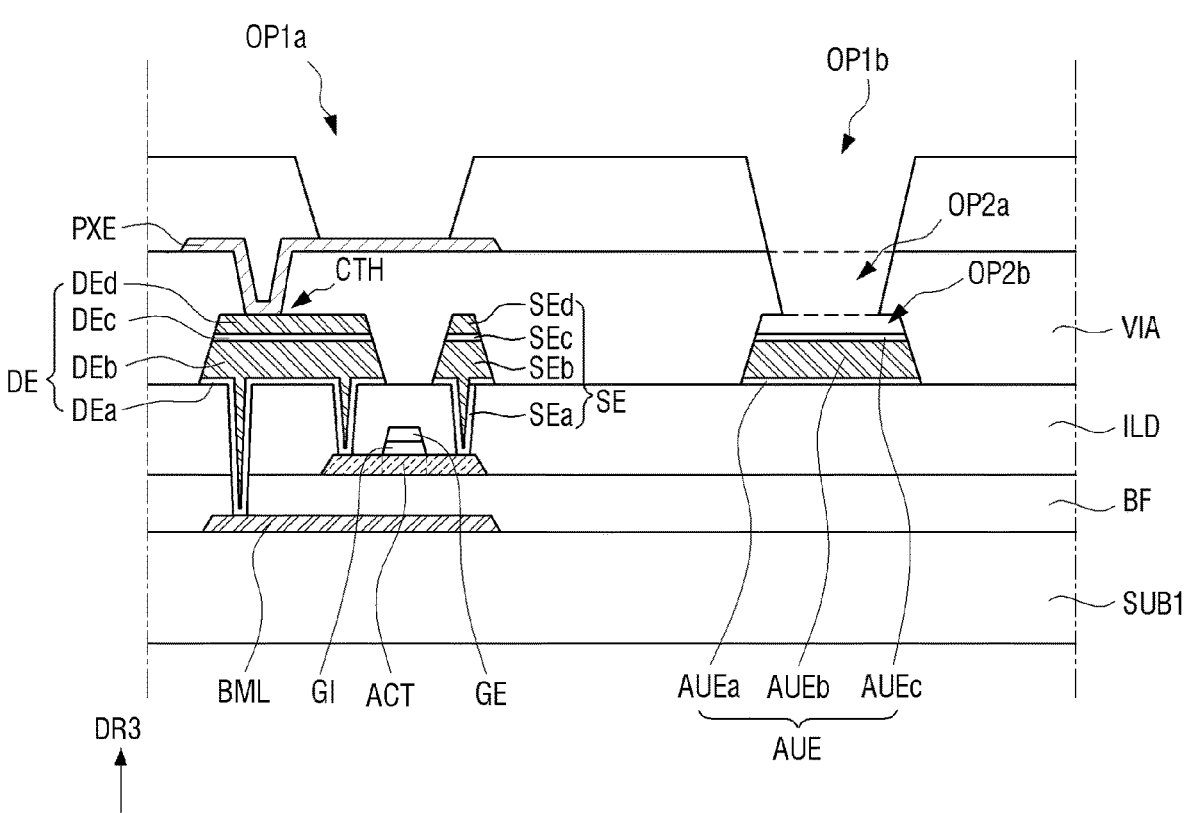

Thereafter, referring to FIG. 17, the photoresist pattern PR may be removed, and a pixel-defining film PDL, which includes first and second openings OP1a and OP1b, may be formed on the via insulating layer VIA.

The formation of the pixel-defining film PDL may be substantially the same as the formation of the via insulating layer VIA, and thus, a redundant detailed description thereof will be omitted for descriptive convenience.

Figure 18:
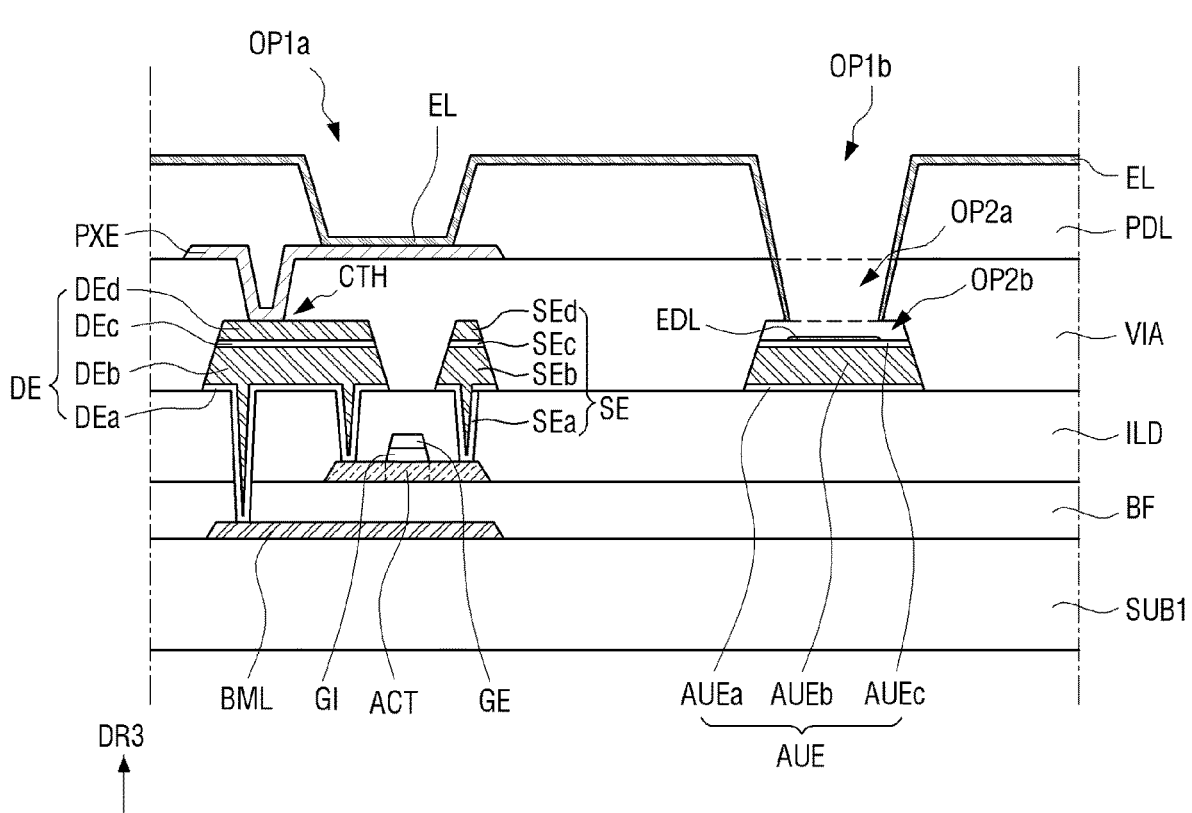

Thereafter, referring to FIG. 18, a middle layer EL may be formed on the pixel-defining film PDL. The middle layer EL may be formed by, for example, a chemical vapor deposition (CVD) process.

For example, the middle layer EL may be deposited with a poor step coverage due to the presence of the via opening OP2, which has an undercut shape, in the via insulating layer VIA. As a result, a dummy part EDL may be disposed on a portion of the top surface (or upper surface) of a third conductive layer AUEc of an auxiliary electrode AUE as a portion of the middle layer EL. For example, parts of the middle layer EL may be disconnected from each other by the via opening OP2 and may thus be able to be driven separately for pixel electrodes PXE of different pixels PX.

Thereafter, a common electrode layer may be formed on the middle layer EL, thereby forming the structure illustrated in FIG. 6. The common electrode layer may be formed by, for example, a sputtering process.

The common electrode layer may have a poor step coverage due to the presence of the via opening OP2, which has an undercut shape, in the via insulating layer VIA. For example, as described above with reference to FIG. 7, a non-contact part NCP, which exposes a portion of the top surface (or upper surface) of the third conductive layer AUEc of the auxiliary electrode AUE, may be formed between a common electrode CE of the common electrode layer and a dummy common electrode CDE of the common electrode layer, which covers the dummy part EDL.

As the common electrode layer is deposited at a lower angle than the middle layer EL, the common electrode layer may cover the top surface and side surfaces (e.g., opposite side surfaces) of the dummy part EDL and the area where the middle layer EL is disconnected (or separated).

According to the embodiment of FIGS. 8 through 18, the oxidation of the auxiliary electrode AUE may be prevented or at least alleviated.

Display devices according to other embodiments will hereinafter be described, focusing on the differences with the display device 1. Like reference numerals indicate like elements, and thus, redundant detailed descriptions thereof will be omitted for descriptive convenience.

FIG. 19 is a schematic cross-sectional view of a pixel of a display device according to another embodiment.

Referring to FIG. 19, a display device 1_1 may include a flexible display panel PNL. For example, the display device 1_1 is substantially the same as (or similar to) the display device 1 except for the structure of a substrate SUB1_1 and the presence of a thin-film encapsulation layer TFE, which is disposed on a common electrode layer.

The substrate SUB1_1 may be bendable, foldable, rollable, or stretchable. The substrate SUB1_1 may be formed of, for example, an insulating material such as a polymer resin. Examples of the polymer material include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and a combination thereof.

The substrate SUB1_1 may include first and second sub-substrates SUB1a and SUB1b, which have flexibility, and a barrier layer BRL, which is disposed between the first and second sub-substrates SUB1a and SUB1b. The first and second sub-substrates SUB1a and SUB1b may be flexible substrates formed of PI. The barrier layer BRL may include silicon nitride, silicon oxide, or silicon oxynitride.

Various device layers disposed on the substrate SUB1_1 may be substantially the same as their respective device layers disposed on the display device 1 of FIG. 6, and thus, redundant detailed descriptions thereof will be omitted for descriptive convenience.

The thin-film encapsulation layer TFE may be disposed on the common electrode layer. The thin-film encapsulation layer TFE may include a first inorganic encapsulation film TFEa, an organic encapsulation film TFEb, and a second inorganic encapsulation film TFEc, which are sequentially stacked. The first and second inorganic encapsulation films TFEa and TFEc may include silicon nitride, silicon oxide, or silicon oxynitride. The organic encapsulation film TFEb may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene (BCB).

The first inorganic encapsulation film TFEa may be disposed on the common electrode layer. In some embodiments, the first inorganic encapsulation film TFEa may fill an undercut in a via insulating layer VIA, around an auxiliary electrode AUE, but embodiments are not limited thereto. For example, the first inorganic encapsulation film TFEa may be disconnected by the undercut in the via insulating layer VIA. FIG. 19 illustrates that the first inorganic encapsulation film TFEa fills the undercut in the via insulating layer VIA.

The organic encapsulation film TFEb may be disposed on the first inorganic encapsulation film TFEa. The organic encapsulation film TFEb may have a relatively large thickness and may substantially remove step differences in the underlying structure. The top surface (or upper surface) of the organic encapsulation film TFEb may be flat, but embodiments are not limited thereto. The organic encapsulation film TFEb may at least partially or completely fill an empty space defined by a via opening OP2 of the via insulating layer VIA and first and second openings OP1*a* and OP1*b* of a pixel-defining film PDL.

The second inorganic encapsulation film TFEc may be disposed on the organic encapsulation film TFEb. For example, the first and second inorganic encapsulation films TFEa and TFEc may be in contact with each other in a non-display area NDA or in a portion of a display area DA to seal the space therein.

The thin-film encapsulation layer TFE may perform an encapsulation function of the second substrate SUB2 of FIG. 2. As the thin-film encapsulation layer TFE is more flexible than a glass substrate, the display panel PNL may have flexibility.

FIG. 20 is a schematic cross-sectional view of an auxiliary electrode of a display device according to another embodiment.

Referring to FIG. 20, a portion of a common electrode CE_2 of a display device 1_2 may cover a dummy part EDL. For example, a left portion of the common electrode CE_2 may include an extension portion CE_2*a* that covers the dummy part EDL. The extension portion CE_2*a* of the left portion of the common electrode CE_2 may be spaced apart from a right portion of the common electrode CE_2.

For example, the left and right parts of the common electrode CE_2 may be spaced apart from each other on the top surface of a third conductive layer AUEc of an auxiliary electrode AUE. Thus, a non-contact part NCP where a common electrode layer is not disposed may be formed on the top surface (or upper surface) of the third conductive layer AUEc of the auxiliary electrode AUE and may be disposed on a side (e.g., on the right side) of the dummy part EDL.

This is because the deposition angle and duration for forming the common electrode CE_2 differ from those for forming the common electrode CE of the display device 1.

According to the embodiment of FIG. 20, the contact between the common electrode CE_2 and the auxiliary electrode AUE may be improved.

FIG. 21 is a schematic cross-sectional view of an auxiliary electrode of a display device according to another embodiment.

Referring to FIG. 21, a common electrode CE_3 of a display device 1_3 may cover a dummy part EDL and may cover the entire top surface of a third conductive layer AUEc of an auxiliary electrode AUE. For example, the common electrode CE_3 may include a connection portion CE_3*a* that connects between left and right portions of the common electrode CE_3 and covers the dummy part EDL. For example, the common electrode CE_3 may not be disconnected by a via opening OP2, but may be continuously (or integrally) formed.

This is because the deposition angle and duration for forming the common electrode CE_3 differ from those for forming the common electrode CE of the display device 1.

According to the embodiment of FIG. 21, the contact between the common electrode CE_3 and the auxiliary electrode AUE may be improved.

In concluding the detailed description, those skilled in the art will appreciate that many variations and modifications may be made to the embodiments without substantially departing from the principles of the invention. Therefore, the disclosed embodiments of the invention are used in a generic and descriptive sense only and not for purposes of limitation.

What is claimed is:

1. A display device comprising:
   a thin-film transistor disposed on a substrate;
   an interlayer insulating layer disposed on the thin-film transistor;
   a source electrode, a drain electrode and an auxiliary electrode disposed on the interlayer insulating layer and spaced apart from each other, each of the source electrode, the drain electrode, and the auxiliary electrode including:
      a main conductive layer, and
      a sub conductive layer disposed on an upper surface of the main conductive layer; and
   a via insulating layer disposed on the source electrode, the drain electrode, and the auxiliary electrode, the via insulating layer covering the source electrode and the drain electrode and exposing a portion of an upper surface of the sub conductive layer of the auxiliary electrode, wherein
   the via insulating layer includes:
      a first part spaced apart from the upper surface of the sub conductive layer of the auxiliary electrode in a thickness direction, and
      a second part disposed on the first part and adjacent to side surfaces of the main conductive layer of the auxiliary electrode and side surfaces of the sub conductive layer of the auxiliary electrode, and
   side surfaces of the first part are inwardly protruded from side surfaces of the second part to form an undercut shape of the via insulating layer, and
   wherein each of the source electrode and the drain electrode further includes an upper conductive layer, the upper conductive layer disposed on the upper surface of the sub conductive layer of each of the source electrode and the drain electrode,
   the upper conductive layer of each of the source electrode and the drain electrode is in contact with the via insulating layer, and
   a distance between a lower surface of the first part of the via insulating layer and the upper surface of the sub conductive layer of the auxiliary electrode is substantially same as a thickness of the upper conductive layer of each of the source electrode and the drain electrode.

2. The display device of claim 1, wherein
the main conductive layer of each of the source electrode, the drain electrode, and the auxiliary electrode includes at least one of copper (Cu) and aluminum (Al),
the sub conductive layer of each of the source electrode, the drain electrode, and the auxiliary electrode includes at least one of titanium (Ti), molybdenum (Mo), and a conductive oxide, and
the upper conductive layer of each of the source electrode and the drain electrode includes at least one of Cu and Al.

3. The display device of claim 1, further comprising:
a pixel electrode disposed on the via insulating layer and connected to the drain electrode through a contact hole penetrating the via insulating layer,
wherein the pixel electrode does not overlap the auxiliary electrode.

4. The display device of claim 3, further comprising:
a pixel-defining film disposed on the pixel electrode and the via insulating layer to expose a portion of an upper surface of the pixel electrode and a portion of the upper surface of the sub conductive layer of the auxiliary electrode; and
a light-emitting layer disposed on the pixel-defining film, wherein the light-emitting layer is in contact with the portion of the upper surface of the pixel electrode exposed by the pixel-defining film and is disconnected in the portion of the auxiliary electrode exposed by the pixel-defining film.

5. The display device of claim 4, further comprising:
a common electrode disposed on the light-emitting layer, wherein the common electrode surrounds the first part of the via insulating layer and is in contact with a portion of the upper surface of the sub conductive layer of the auxiliary electrode.

6. The display device of claim 5, further comprising:
a light-emitting dummy layer disposed on the upper surface of the sub conductive layer of the auxiliary electrode, the light-emitting dummy layer and the light-emitting layer formed of a same layer,
wherein the light-emitting dummy layer is disconnected from the light-emitting layer.

7. The display device of claim 6, further comprising:
a dummy common electrode disposed on the upper surface of the sub conductive layer of the auxiliary electrode and covering the light-emitting dummy layer, the dummy common electrode and the common electrode formed of a same layer,
wherein the dummy common electrode is spaced apart from the common electrode, and is disposed on the upper surface of the sub conductive layer of the auxiliary electrode.

8. The display device of claim 6, wherein the common electrode covers the light-emitting dummy layer and a portion of the upper surface of the sub conductive layer of the auxiliary electrode that is exposed by the light-emitting dummy layer.

9. An electronic device comprising:
a thin-film transistor disposed on a substrate;
an interlayer insulating layer disposed on the thin-film transistor;
a source electrode, a drain electrode, and an auxiliary electrode disposed on the interlayer insulating layer and spaced apart from each other, each of the source electrode, the drain electrode, and the auxiliary electrode including:
a main conductive layer, and
a sub conductive layer disposed on an upper surface of the main conductive layer; and
a via insulating layer disposed on the source electrode, the drain electrode, and the auxiliary electrode, the via insulating layer covering the source electrode and the drain electrode and including an opening exposing an upper surface of the sub conductive layer of the auxiliary electrode, wherein
the opening of the via insulating layer includes:
a first opening part exposing a first portion of the upper surface of the sub conductive layer of the auxiliary electrode, and
a second opening part overlapping the first opening part, having a width greater than a width of the first opening part, and exposing a second portion of the upper surface of the sub conductive layer of the auxiliary electrode greater than the first portion of the upper surface of the sub conductive layer of the auxiliary electrode,
wherein each of the source electrode and the drain electrode further includes an upper conductive layer, the upper conductive layer disposed on the upper surface of the sub conductive layer of each of the source electrode and the drain electrode,
the upper conductive layer of each of the source electrode and the drain electrode is in contact with the via insulating layer, and
the first opening part of the opening of the via insulating layer is spaced apart from the upper surface of the sub conductive layer of the auxiliary electrode in a thickness direction, and
a distance between a lower portion of the first opening part of the opening of the via insulating layer and the upper surface of the sub conductive layer of the auxiliary electrode is substantially same as a thickness of the upper conductive layer of each of the source electrode and the drain electrode.

10. The electronic device of claim 9, wherein
the main conductive layer of each of the source electrode, the drain electrode, and the auxiliary electrode includes at least one of copper (Cu) and aluminum (Al),
the sub conductive layer of each of the source electrode, the drain electrode, and the auxiliary electrode includes at least one of titanium (Ti), molybdenum (Mo), and a conductive oxide, and
the upper conductive layer of each of the source electrode and the drain electrode includes at least one of Cu and Al.

11. The electronic device of claim 9, further comprising:
a pixel electrode disposed on the via insulating layer and connected to the drain electrode through a contact hole penetrating the via insulating layer,
wherein the pixel electrode does not overlap the auxiliary electrode.

12. The electronic device of claim 11, further comprising:
a pixel-defining film including:
a first opening exposing a portion of an upper surface of the pixel electrode, and
a second opening exposing a portion of the upper surface of the sub conductive layer of the auxiliary electrode; and
a light-emitting layer disposed on the pixel-defining film, wherein the light-emitting layer is in contact with the upper surface of the pixel electrode in the first opening of the pixel-defining film, and is disconnected in the second opening of the pixel-defining film.

13. The electronic device of claim 12, further comprising: a common electrode disposed on the light-emitting layer, wherein the common electrode extends to the opening of the via insulating layer beyond the second opening of the pixel-defining film and is in contact with a portion of the upper surface of the sub conductive layer of the auxiliary electrode.

14. The electronic device of claim 13, further comprising: a light-emitting dummy layer disposed on the upper surface of the sub conductive layer of the auxiliary electrode, the light-emitting dummy layer and the light-emitting layer formed of a same layer, wherein the light-emitting dummy layer is disconnected from the light-emitting layer.

15. A method of manufacturing a display device, comprising:

forming a thin-film transistor on a substrate;

forming an interlayer insulating layer on the thin-film transistor;

forming a source electrode, a drain electrode, and an auxiliary electrode as a same layer on the interlayer insulating layer, each of the source electrode, the drain electrode, and the auxiliary electrode including:

a main conductive layer, a sub conductive layer disposed on an upper surface of the main conductive layer, and an upper conductive layer disposed on an upper surface of the sub conductive layer;

forming a via insulating layer on the source electrode, the drain electrode, and the auxiliary electrode, the via insulating layer covering the source electrode, the drain electrode and exposing the upper surface of the sub conductive layer of the auxiliary electrode;

forming a pixel electrode layer on the via insulating layer;

forming a photoresist pattern on a portion of the pixel electrode layer overlapping the source electrode and the drain electrode; and forming an undercut in the via insulating layer by etching the upper conductive layer of the auxiliary electrode and a portion of the pixel electrode layer where the photoresist pattern is not formed, wherein the upper conductive layer of each of the source electrode and the drain electrode is in contact with the via insulating layer, and a distance between a lower surface of a first part of the via insulating layer and the upper surface of the sub conductive layer of the auxiliary electrode is substantially same as a thickness of the upper conductive layer of each of the source electrode and the drain electrode.

16. The method of claim 15, wherein the main conductive layer and the upper conductive layer of each of the source electrode, the drain electrode and the auxiliary electrode include at least one of copper (Cu) and aluminum (Al), and the sub conductive layer of each of the source electrode, the drain electrode, and the auxiliary electrode includes at least one of titanium (Ti), molybdenum (Mo), and a conductive oxide.

\* \* \* \* \*